United States Patent [19]

Mehrotra et al.

[11] Patent Number: 5,163,021

[45] Date of Patent: Nov. 10, 1992

[54] MULTI-STATE EEPROM READ AND WRITE CIRCUITS AND TECHNIQUES

[75] Inventors: Sanjay Mehrotra, Milpitas; Eliyahou Harari, Los Gatos; Winston Lee, San Francisco, all of Calif.

[73] Assignee: SunDisk Corporation, Santa Clara, Calif.

[21] Appl. No.: 734,221

[22] Filed: Jul. 22, 1991

Related U.S. Application Data

[60] Division of Ser. No. 508,273, Apr. 11, 1990, which is a continuation-in-part of Ser. No. 337,579, Apr. 13, 1989, abandoned.

[51] Int. Cl.$^5$ .................. G11C 7/00; G11C 16/00; G11C 29/00
[52] U.S. Cl. .................. 365/185; 365/201; 365/104; 330/2
[58] Field of Search ............ 365/185, 104, 201, 207; 330/2, 257, 288

[56] References Cited

U.S. PATENT DOCUMENTS

| | | | |
|---|---|---|---|
| 4,393,475 | 7/1983 | Kitagawa et al. | 365/207 |
| 4,415,992 | 11/1983 | Adloch | 365/207 X |
| 4,799,195 | 1/1989 | Iwahashi et al. | 365/185 |
| 4,807,188 | 2/1989 | Casagrande | 365/185 |
| 4,956,816 | 9/1990 | Atsumi et al. | 365/185 X |
| 4,999,813 | 3/1991 | Ohtsuka et al. | 365/185 X |

Primary Examiner—Alyssa H. Bowler
Attorney, Agent, or Firm—Majestic, Parsons, Siebert & Hsue

[57] ABSTRACT

Improvements in the circuits and techniques for read, write and erase of EEprom memory enable nonvolatile multi-state memory to operate with enhanced performance over an extended period of time. In the improved circuits for normal read, and read between write or erase for verification, the reading is made relative to a set of threshold levels as provided by a corresponding set of reference cells which closely track and make adjustment for the variations presented by the memory cells. In one embodiment, each Flash sector of memory cells has its own reference cells for reading the cells in the sector, and a set of reference cells also exists for the whole memory chip acting as a master reference. In another embodiment, the reading is made relative to a set of threshold levels simultaneously by means of a one-to-many current mirror circuit. In improved write or erase circuits, verification of the written or erased data is done in parallel on a group of memory cells at a time and a circuit selectively inhibits further write or erase to those cells which have been correctly verified. Other improvements includes programming the ground state after erase, independent and variable power supply for the control gate of EEprom memory cells.

30 Claims, 21 Drawing Sheets

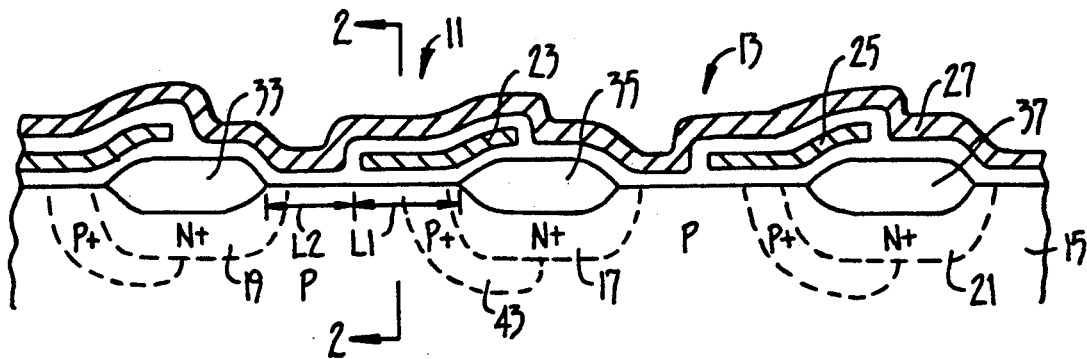
FIG._1.
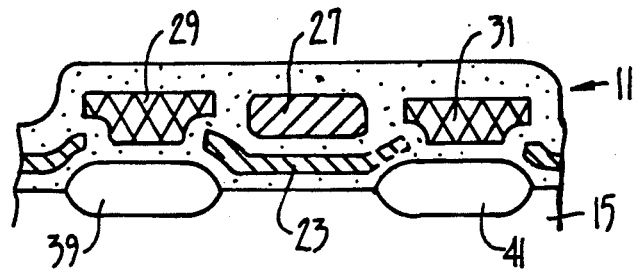
FIG._2.
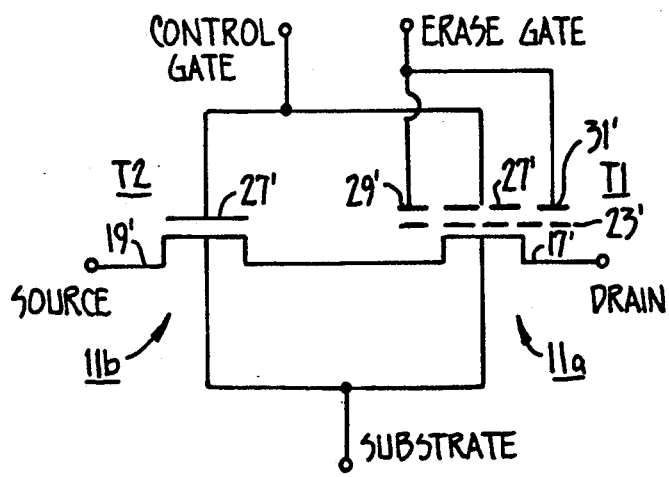
FIG._3.

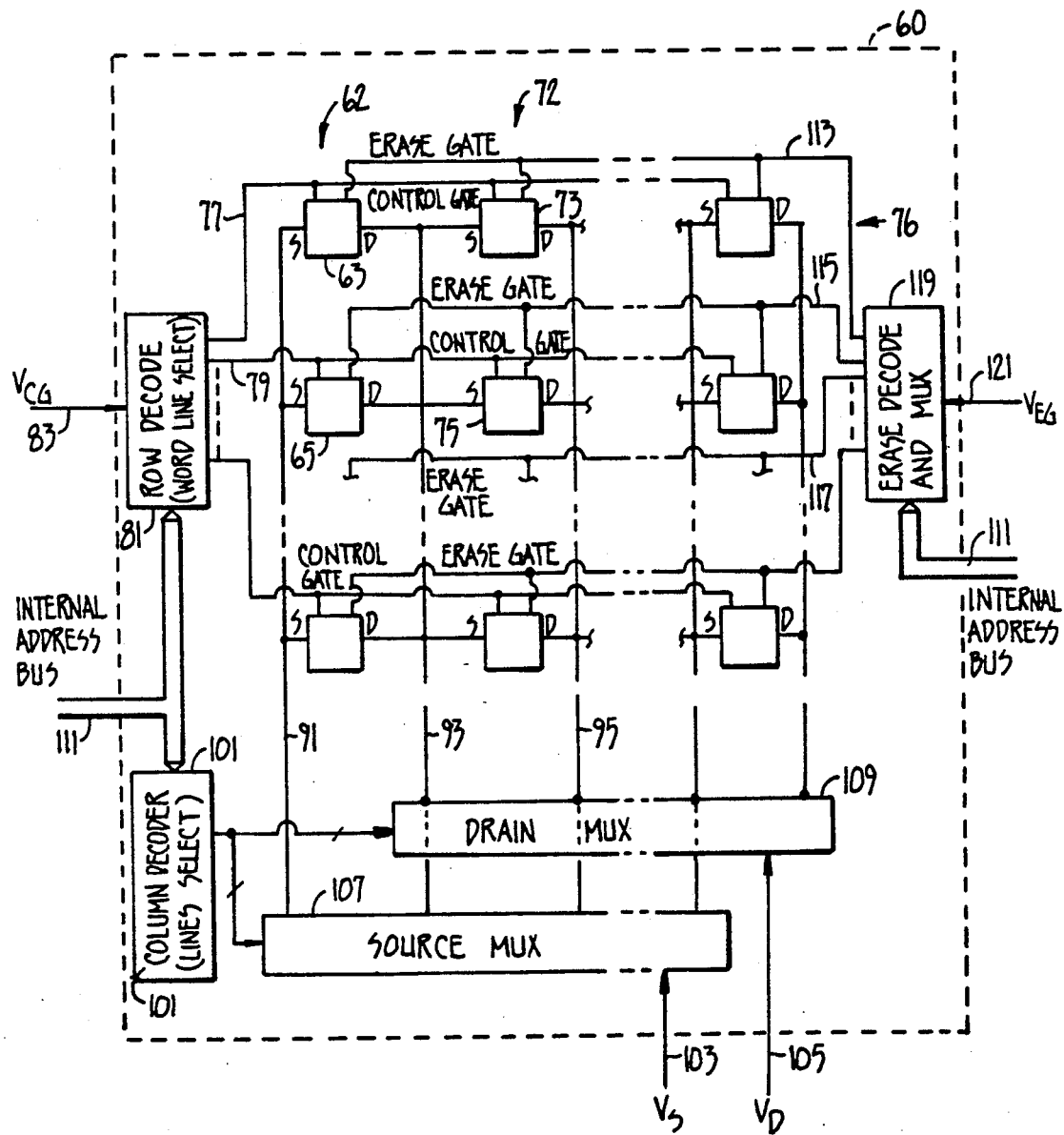
FIG._4.

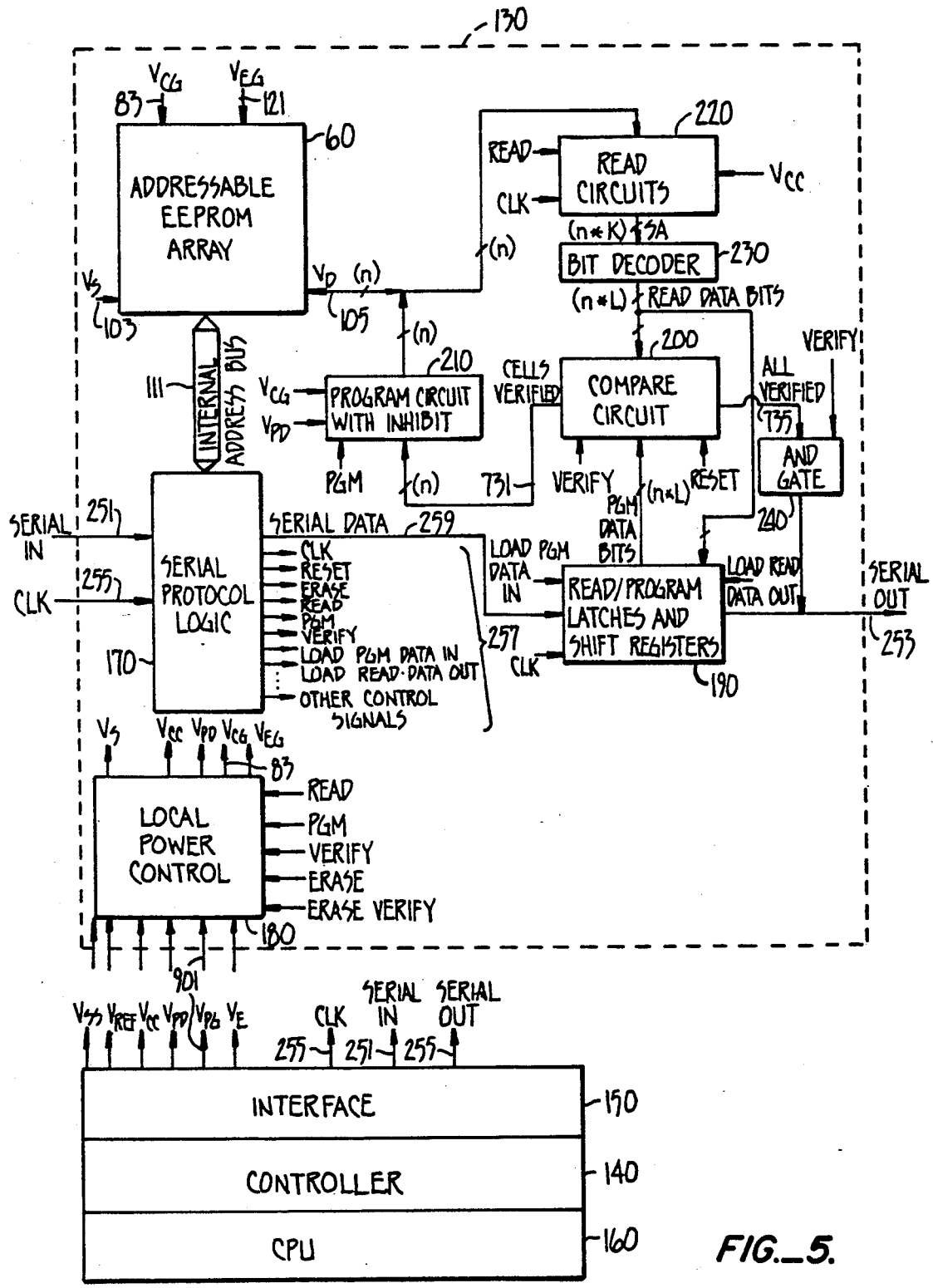
FIG._5.

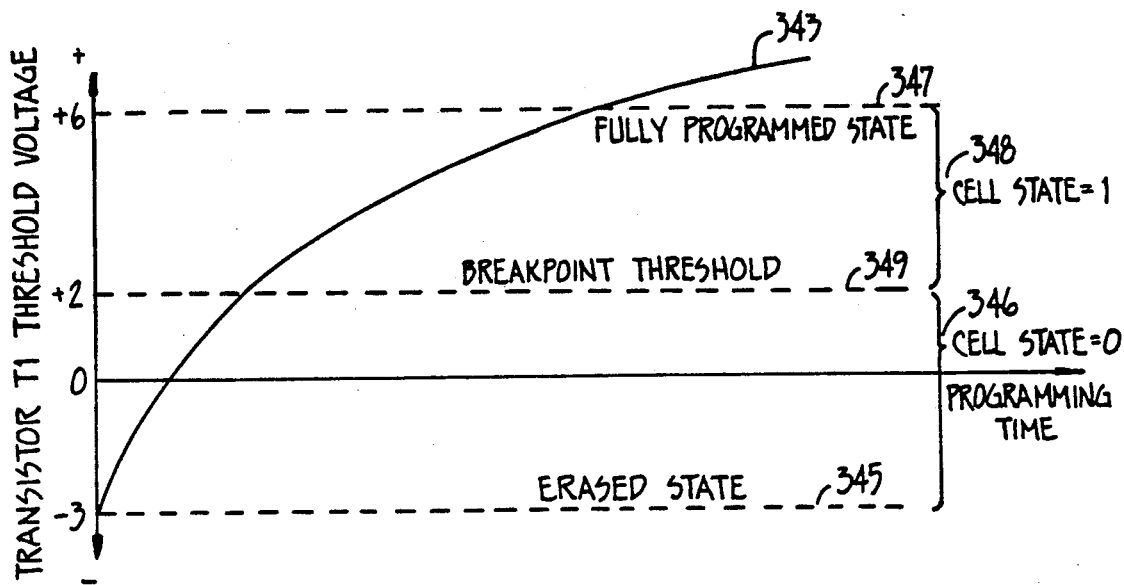
FIG._6.
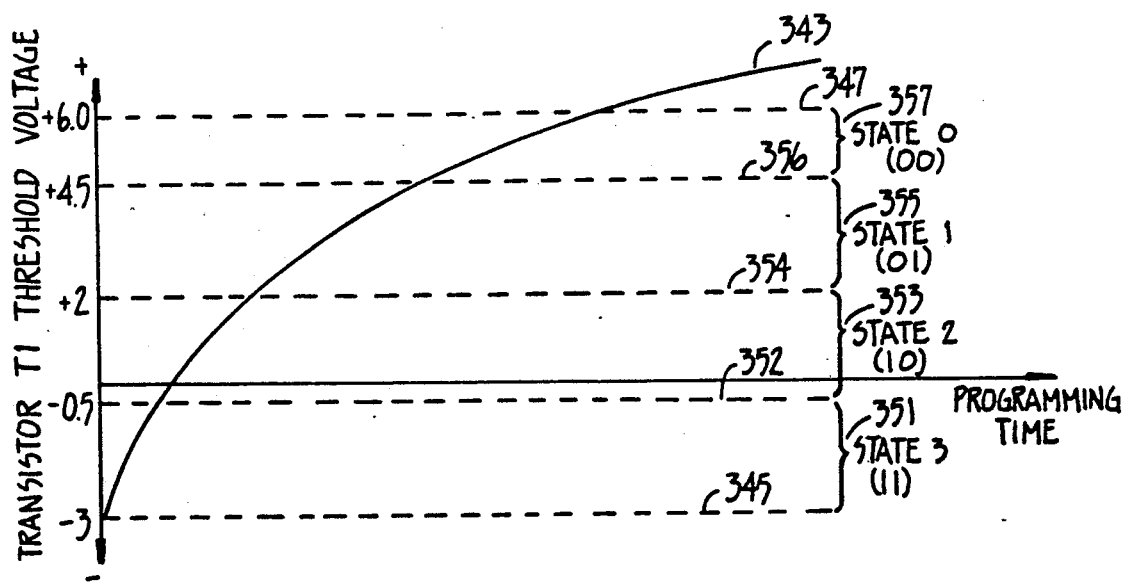
FIG._7A.

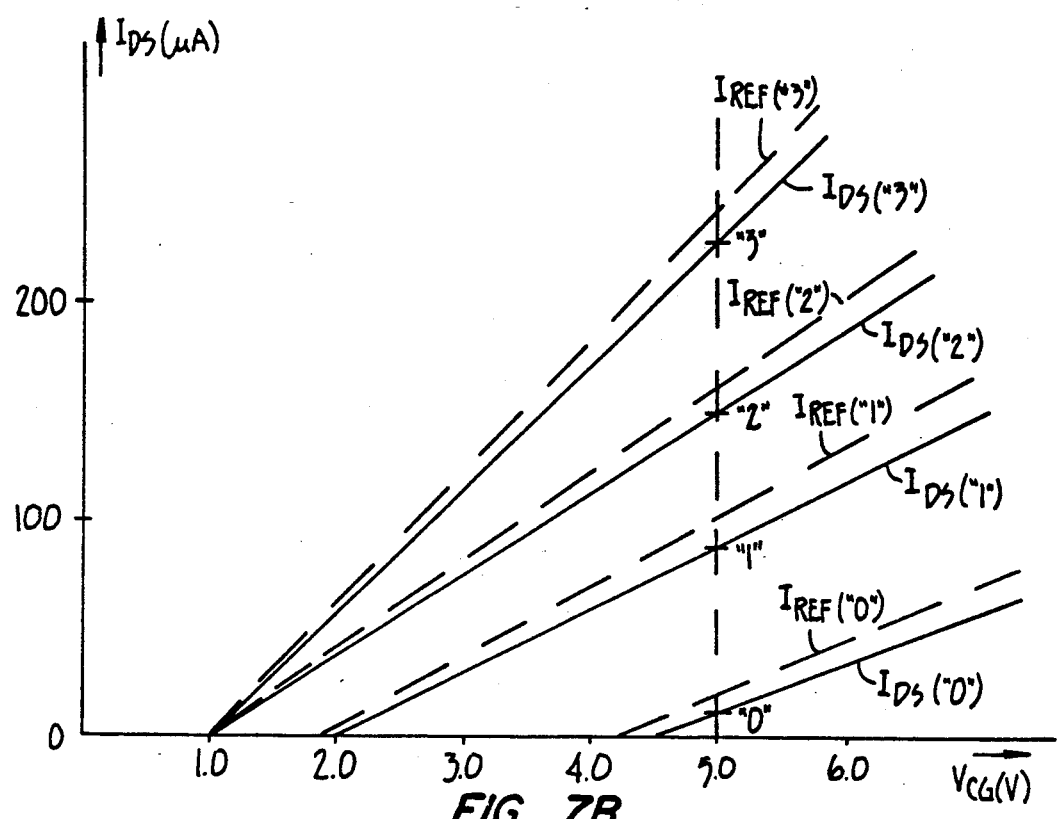
FIG._7B.
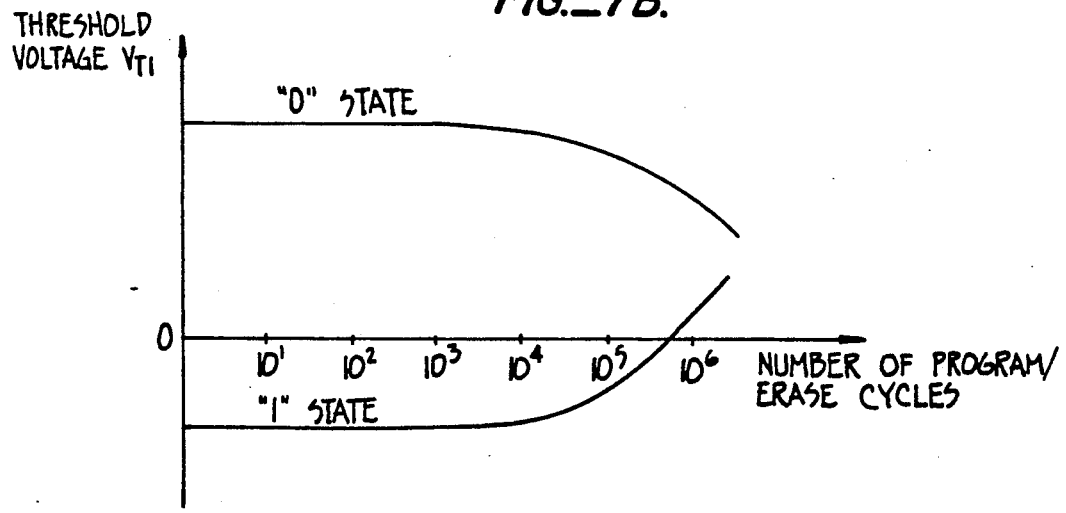
FIG._8A.
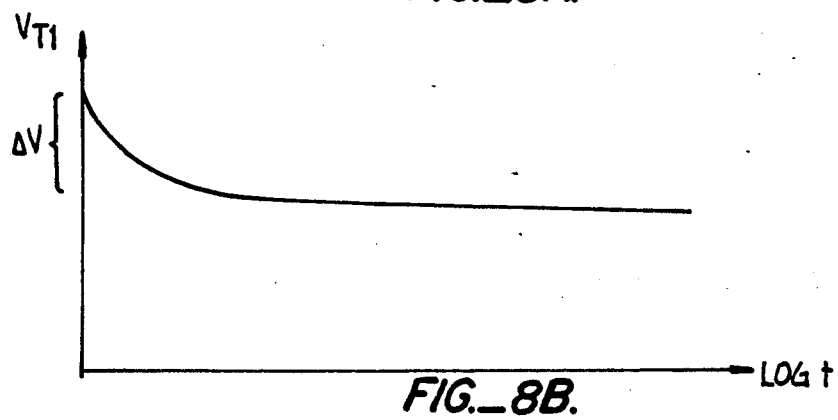
FIG._8B.

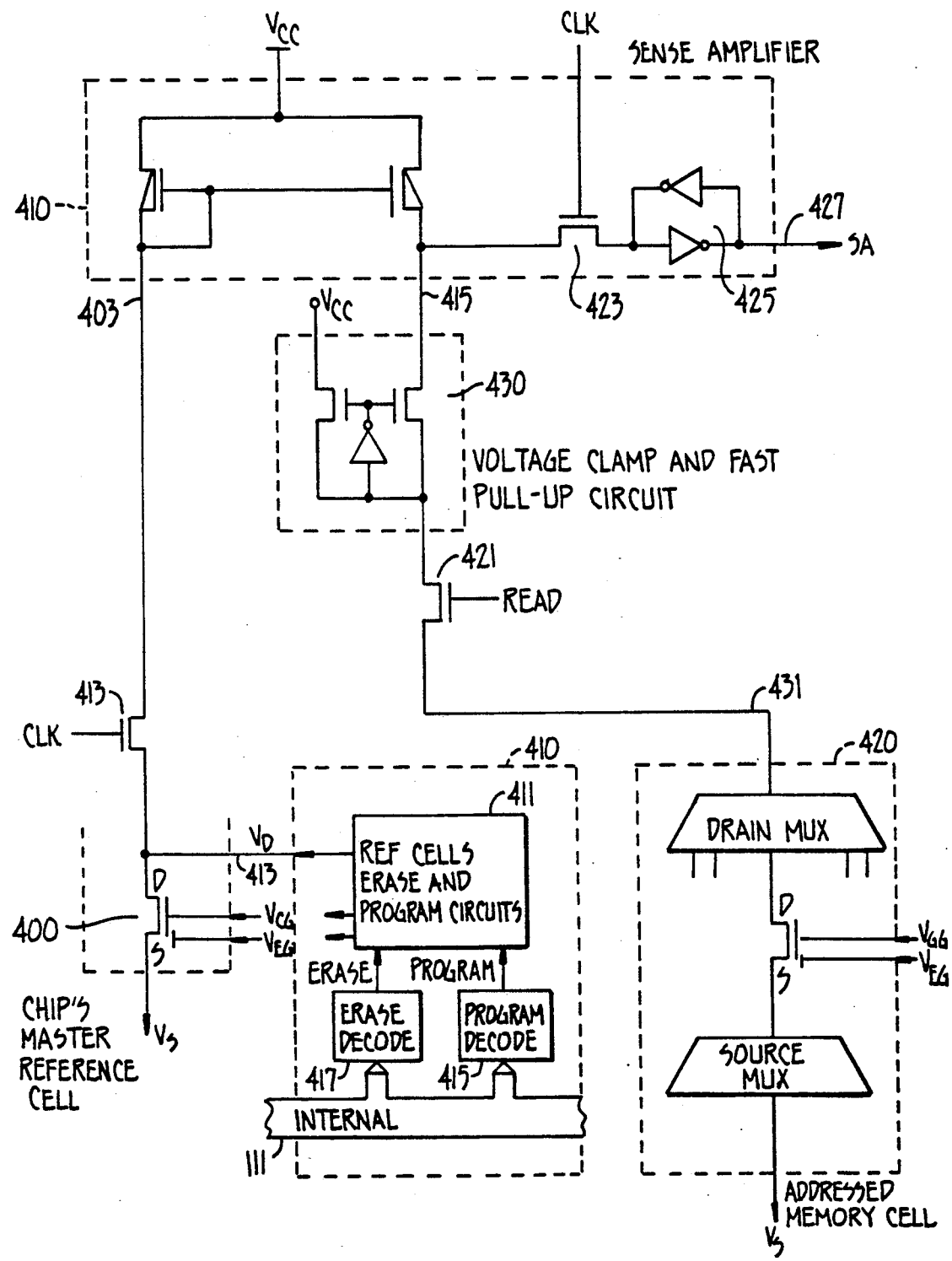
FIG._9A.

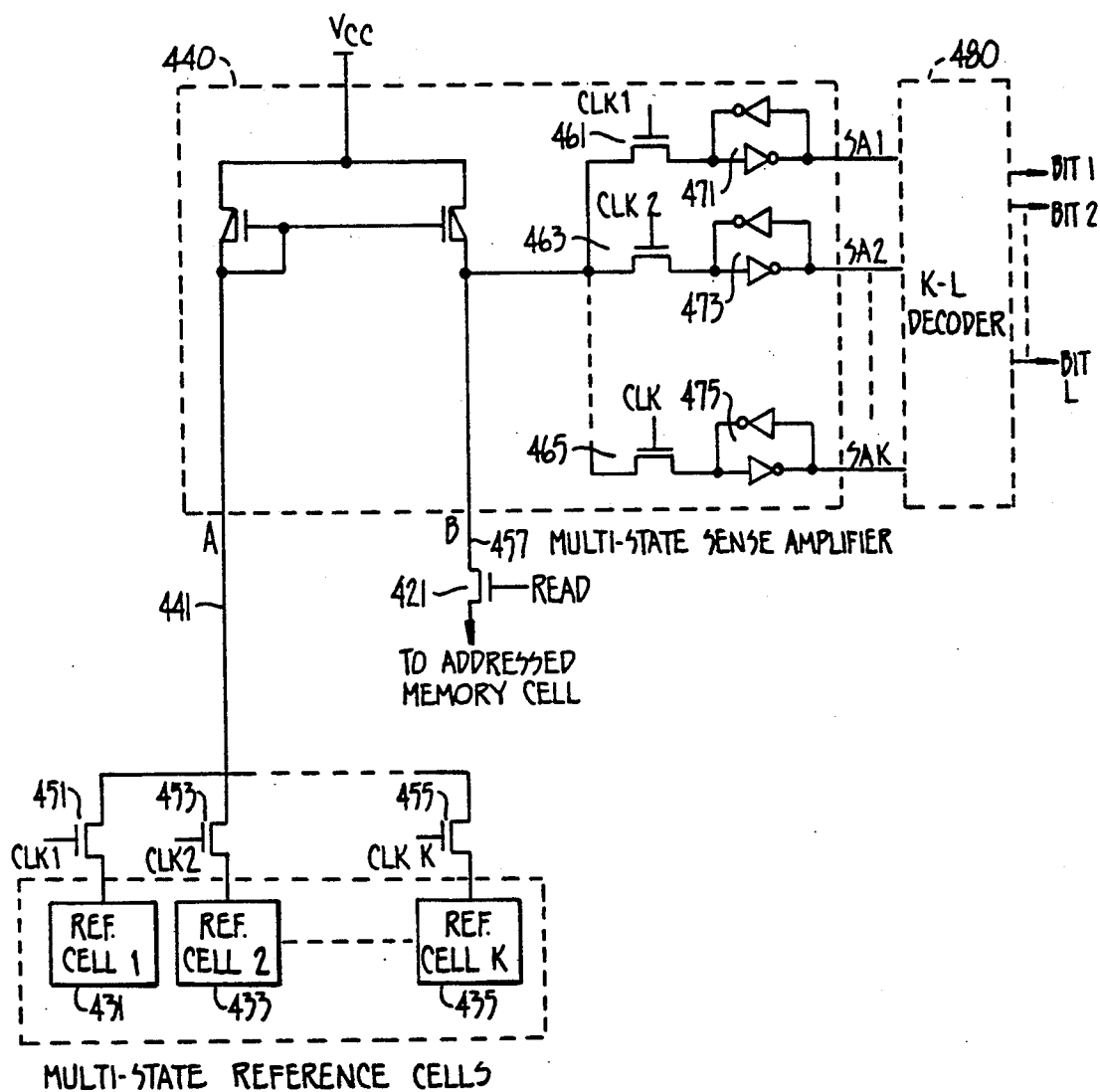
FIG_9B.

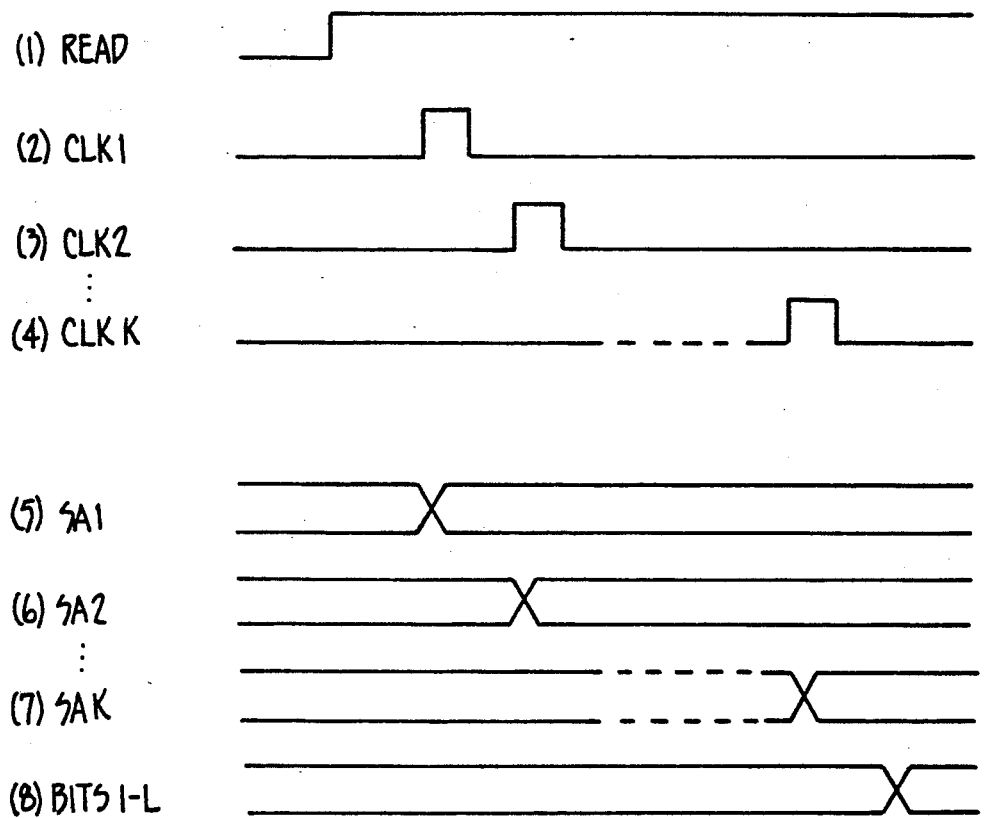
FIG._9C.
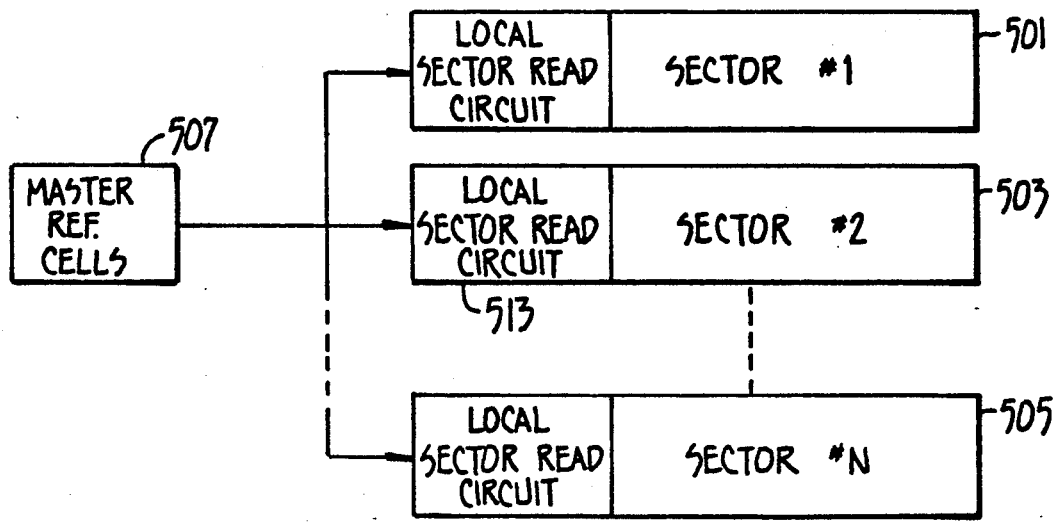
FIG._10.

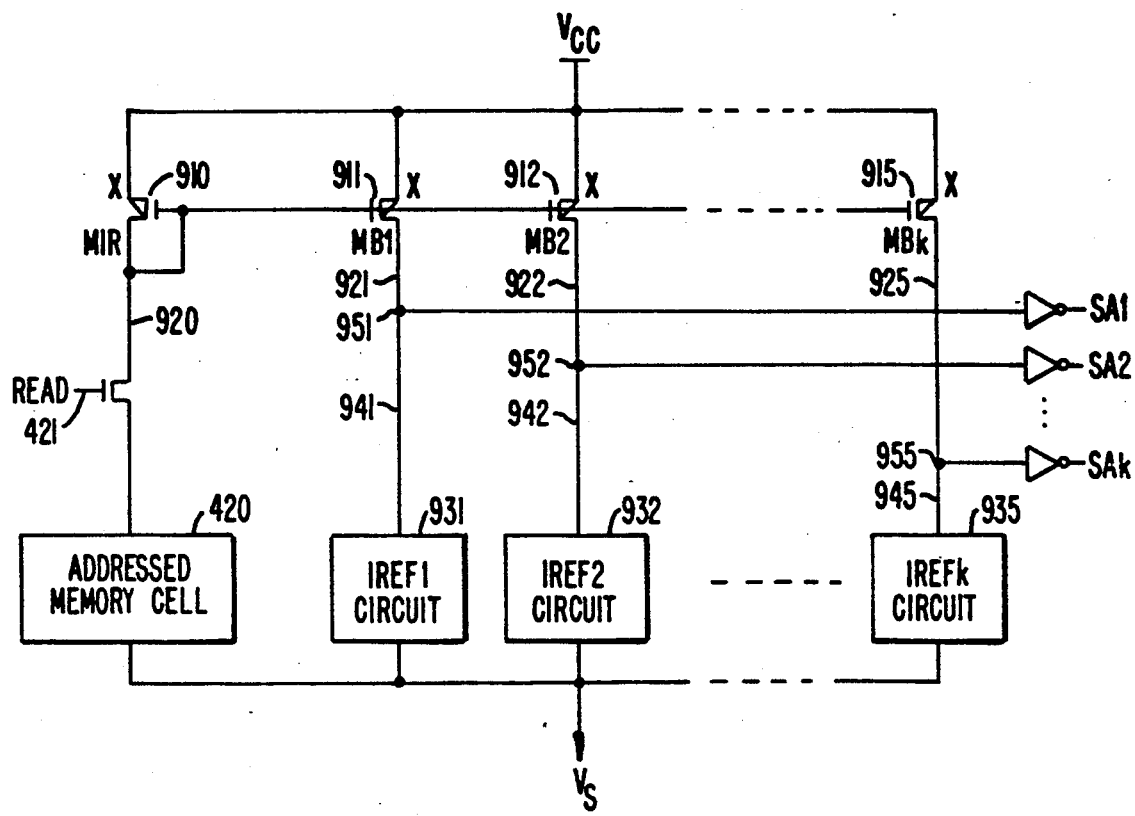
FIG._9D.
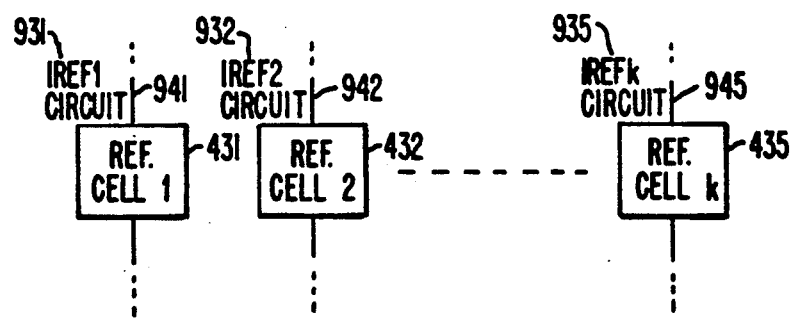
FIG._9E.

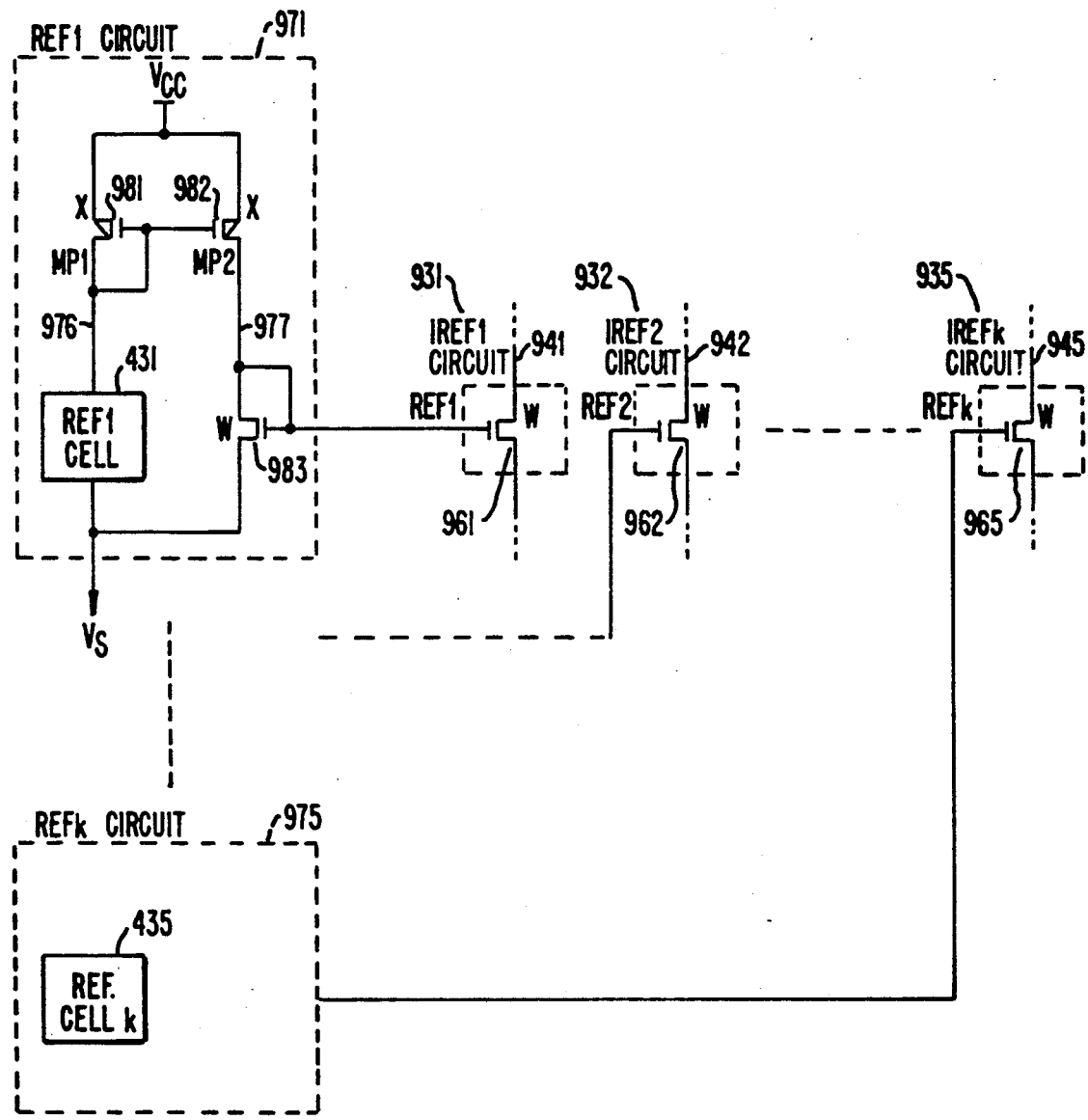
FIG._9F.

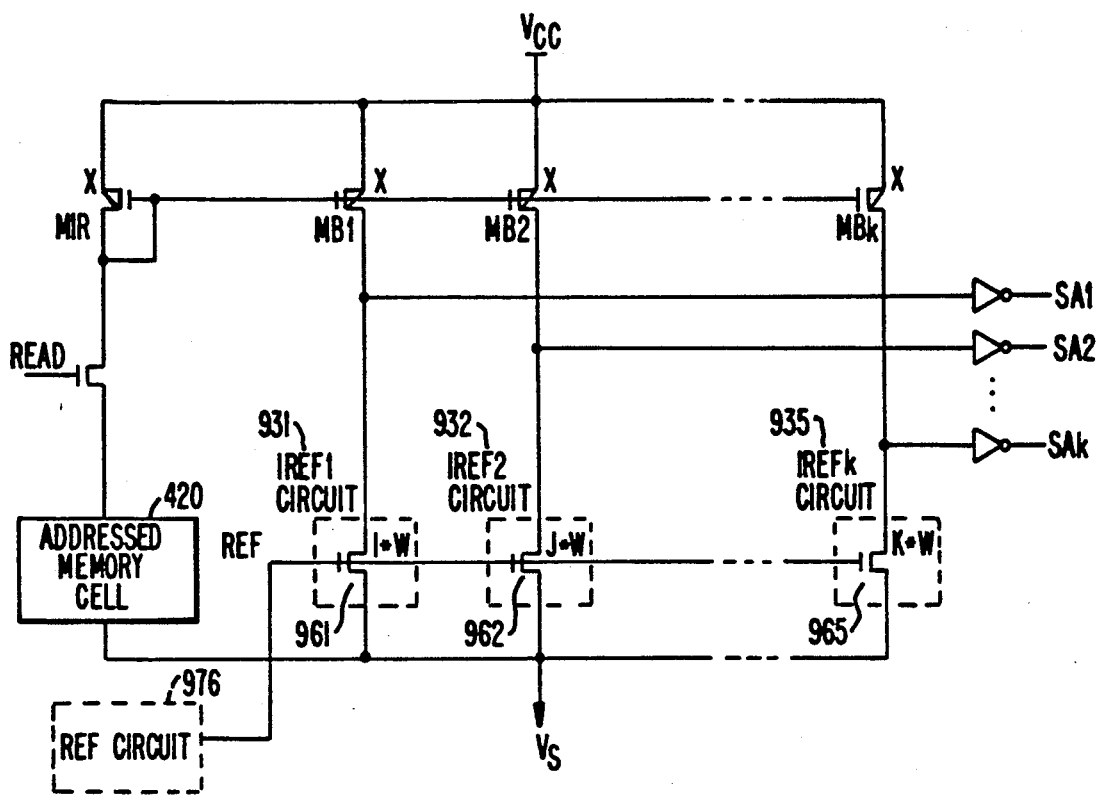
FIG._9G.
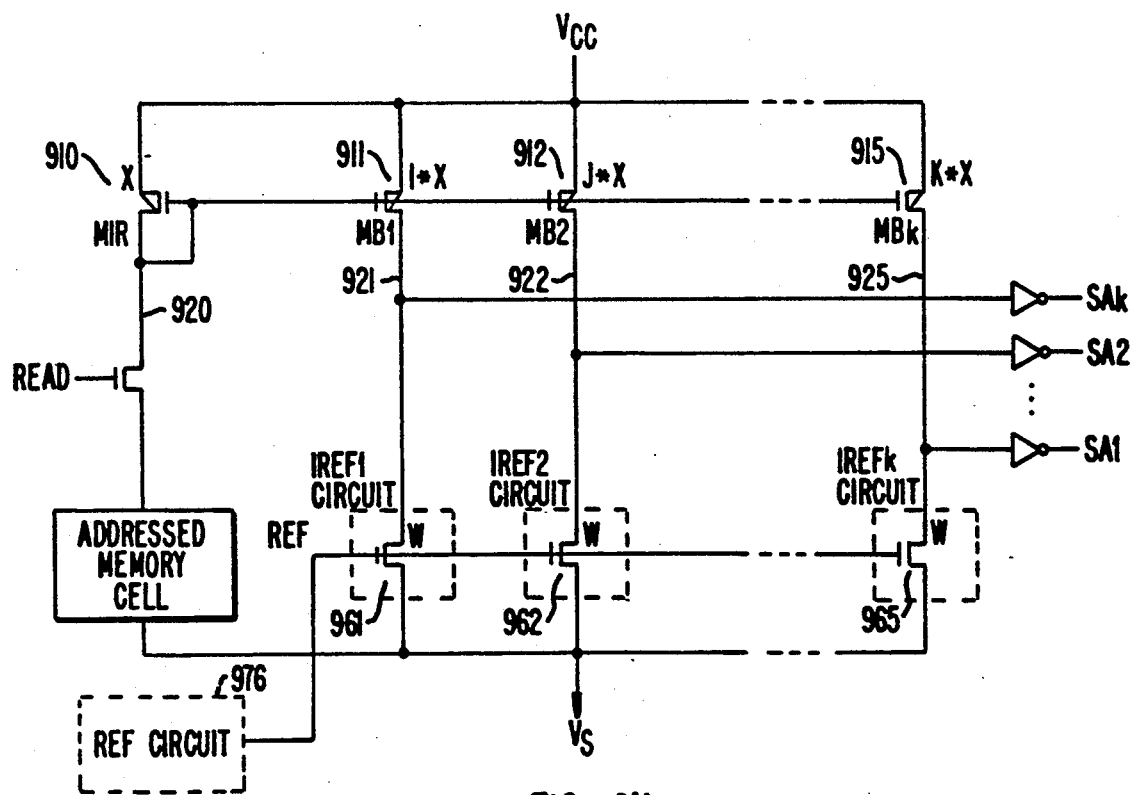
FIG._9H.

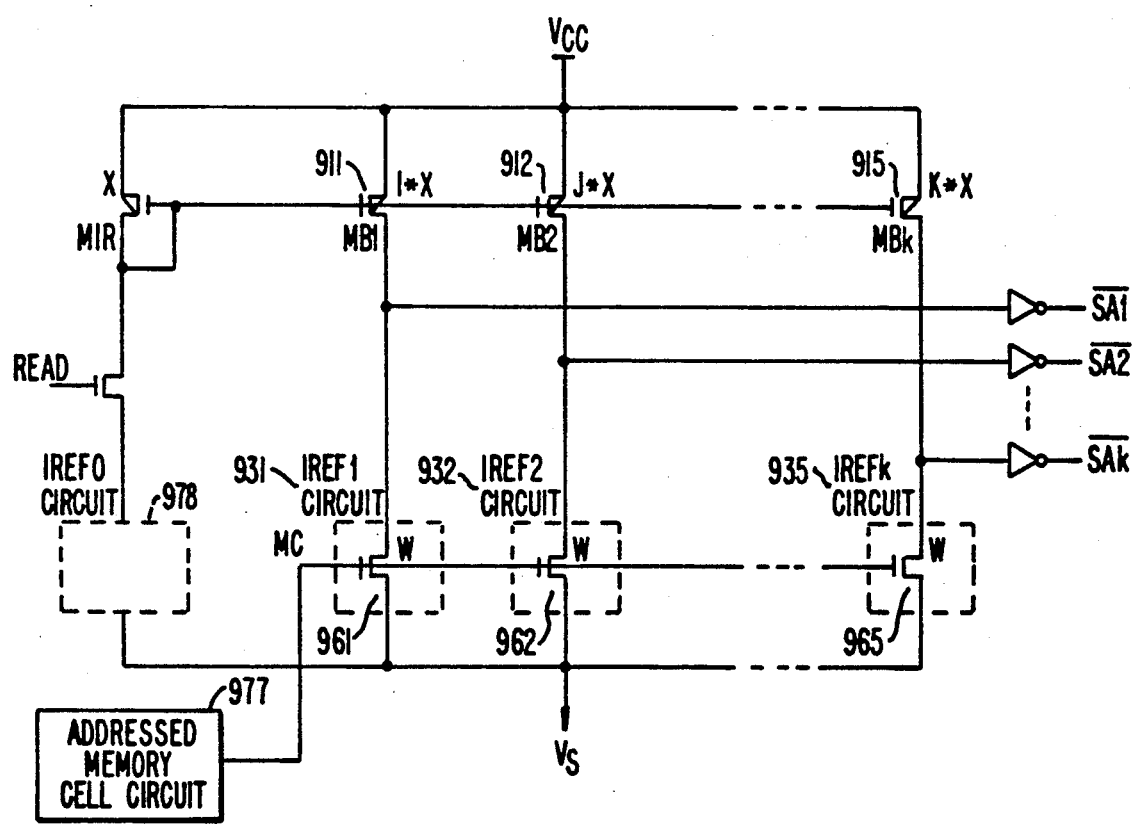
FIG._9I.

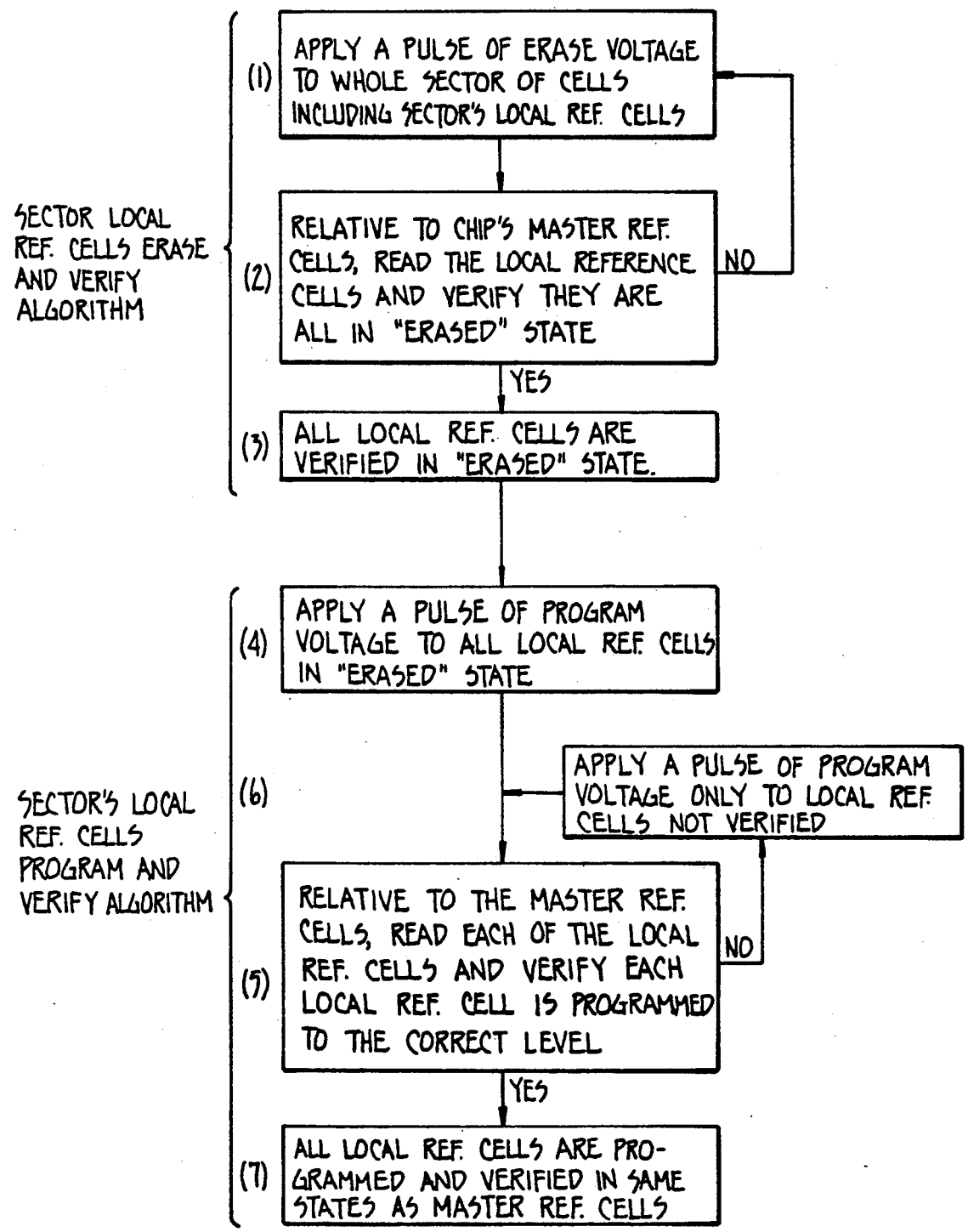
FIG._11.

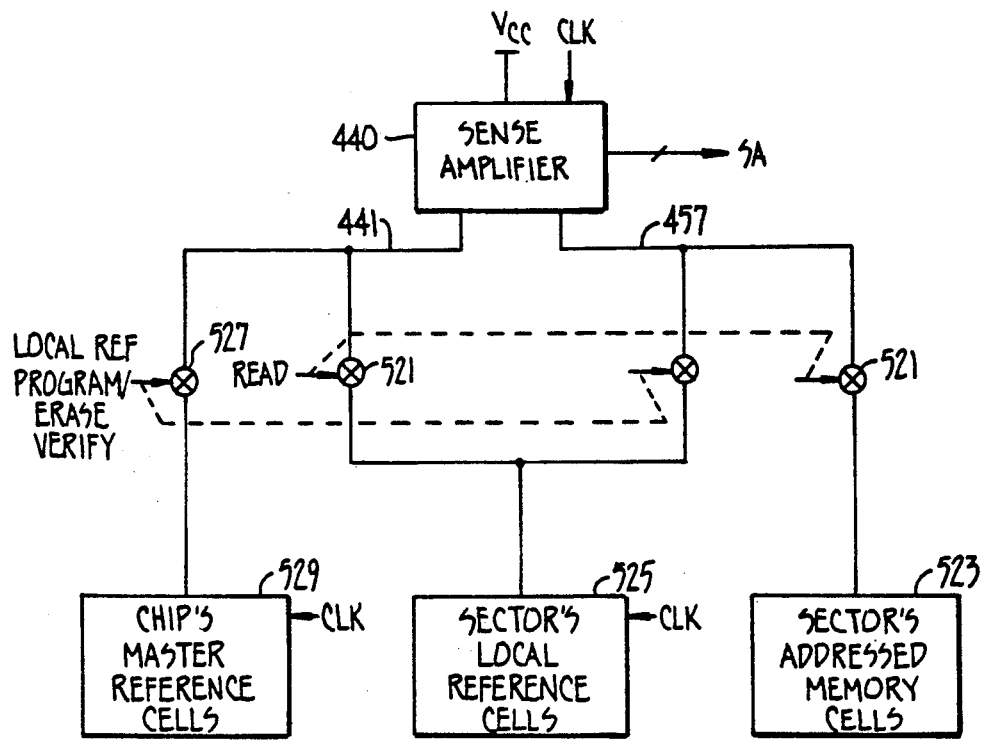
FIG._12A.
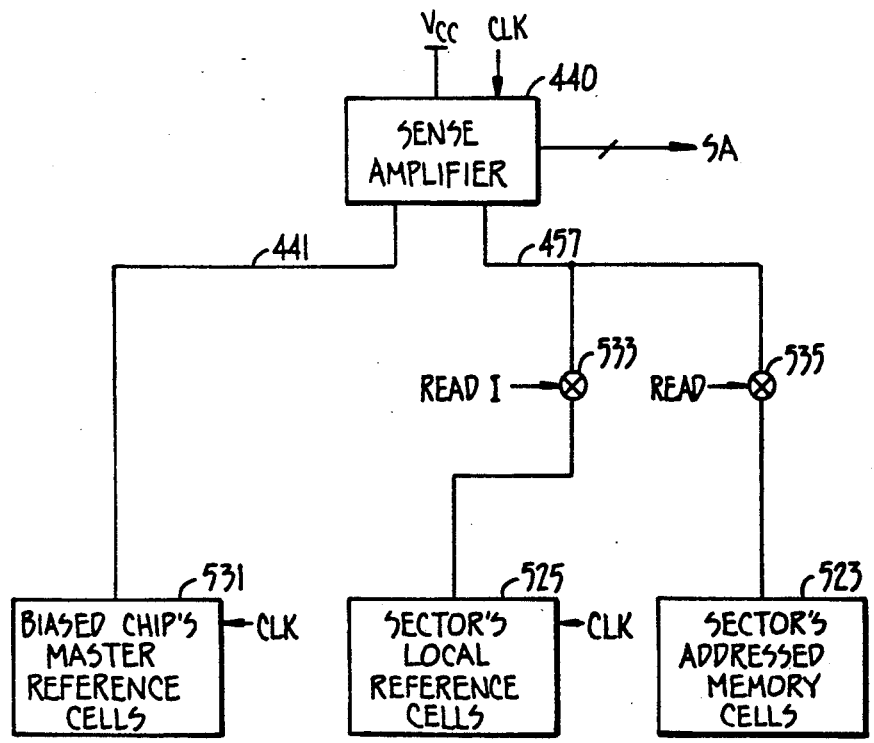
FIG._13A.

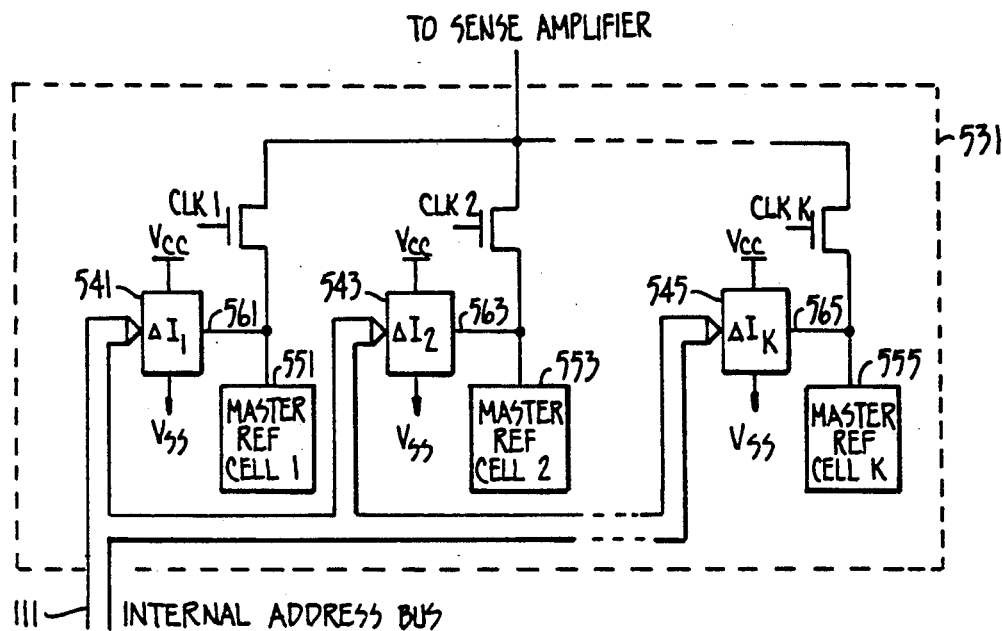
FIG._13B.
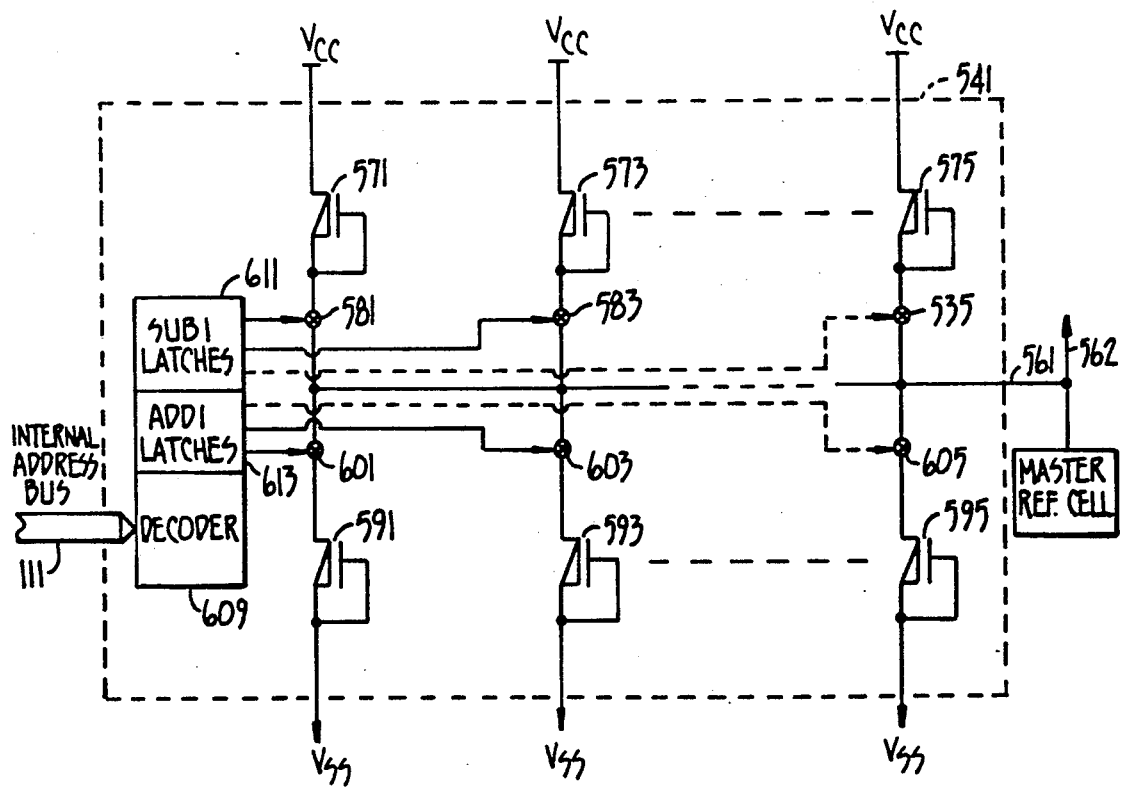
FIG._13C.

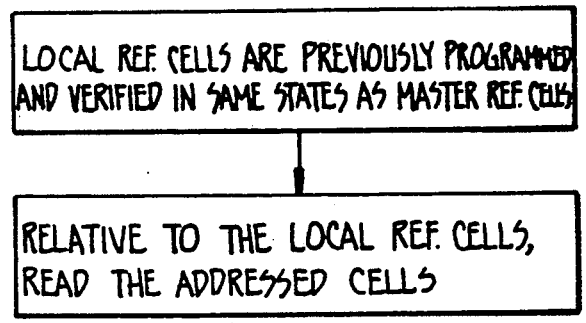
FIG._12B.
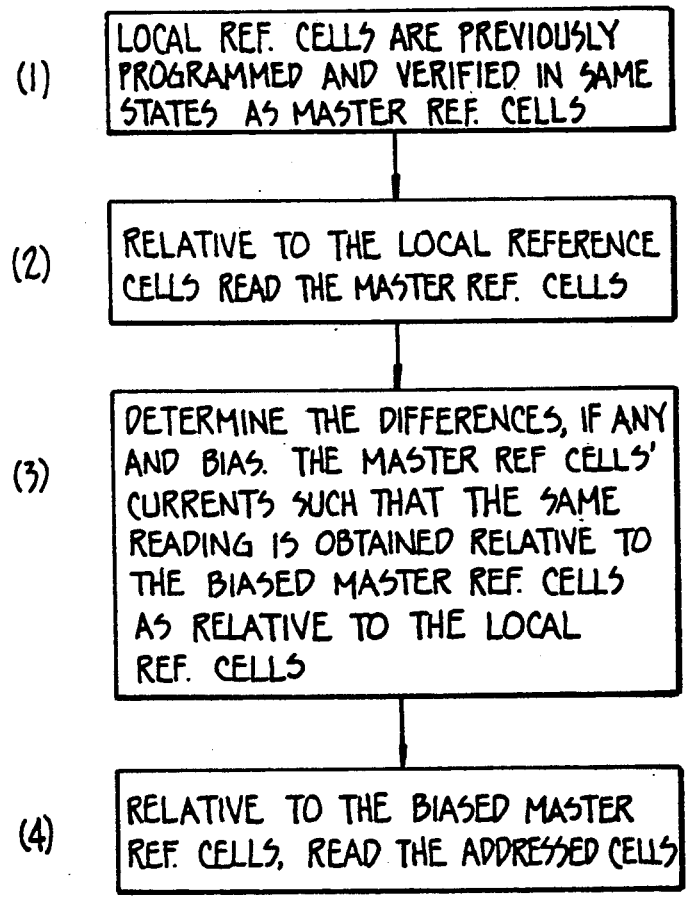
FIG._13D.

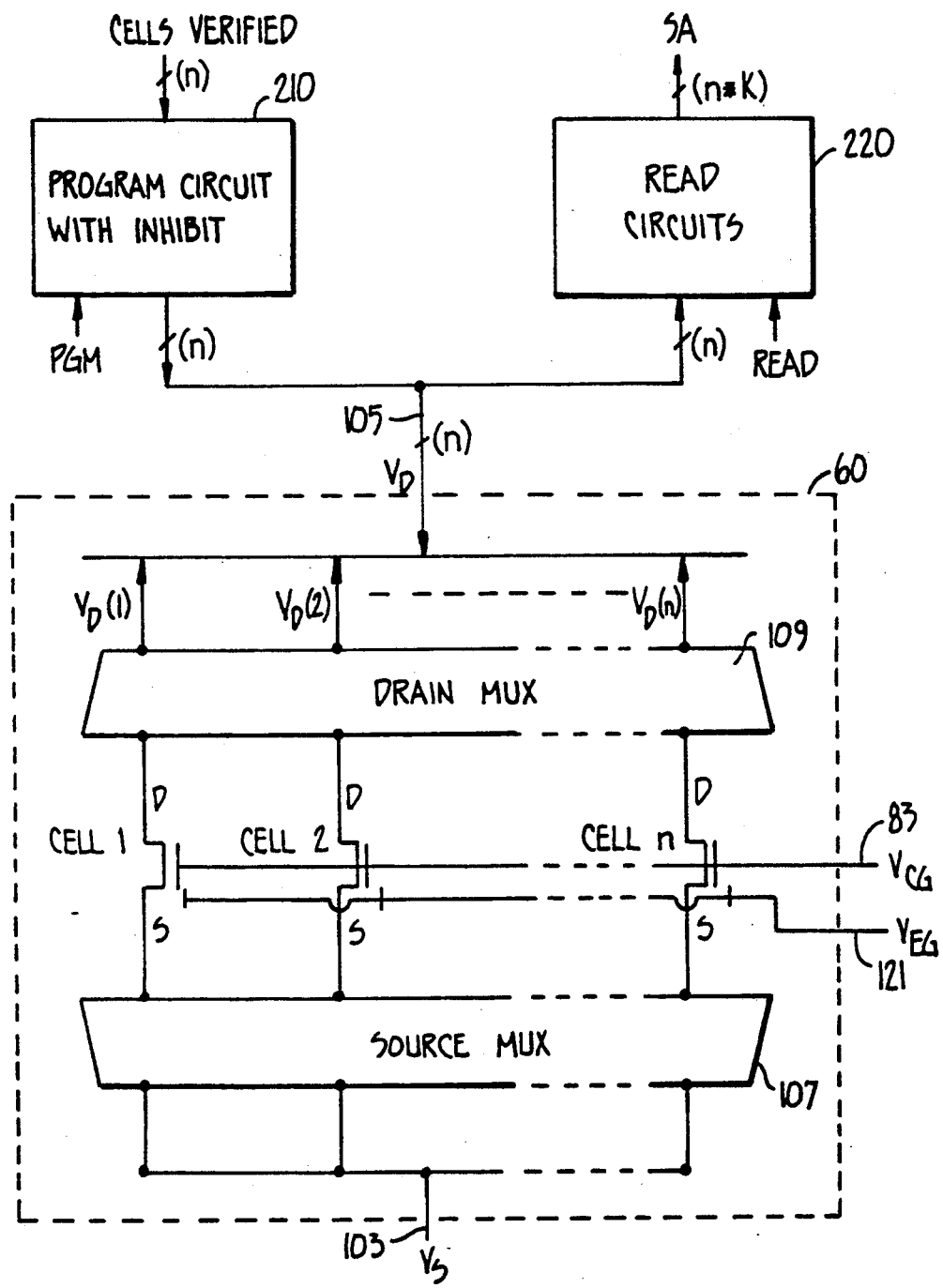
READ/PROGRAM DATA PATHS FOR n CELLS IN PARALLEL
FIG._14.

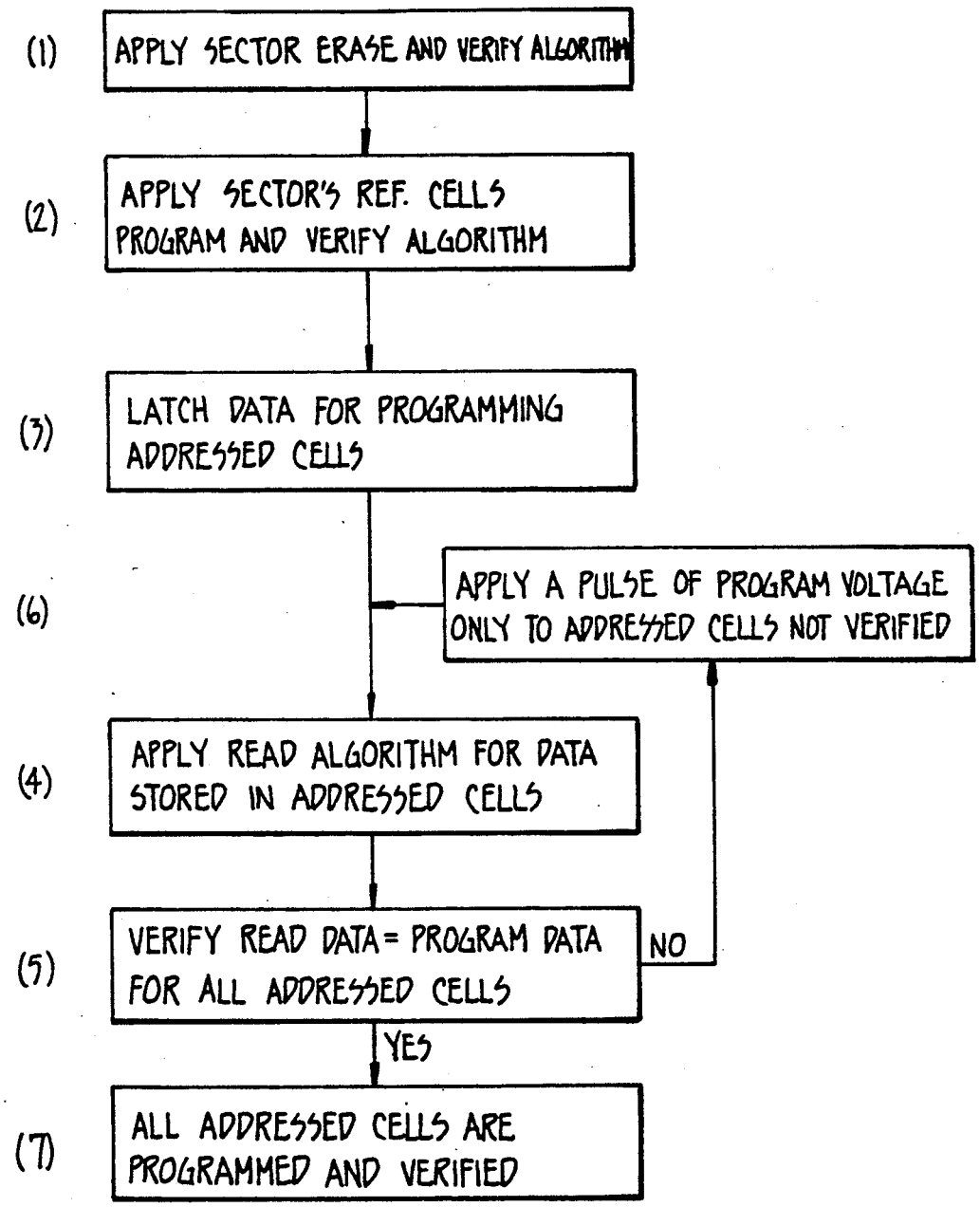
FIG._15.

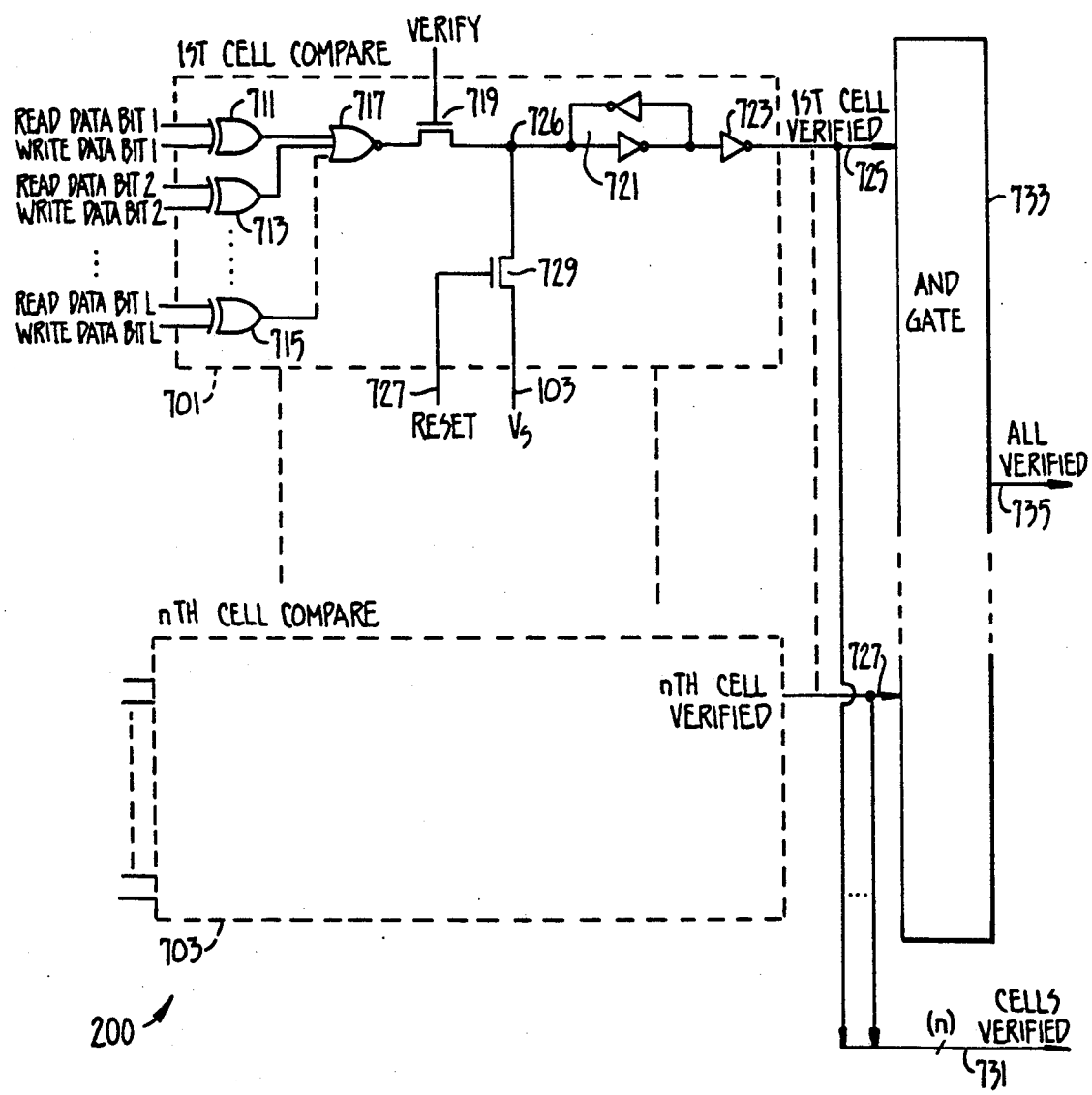
FIG._16.

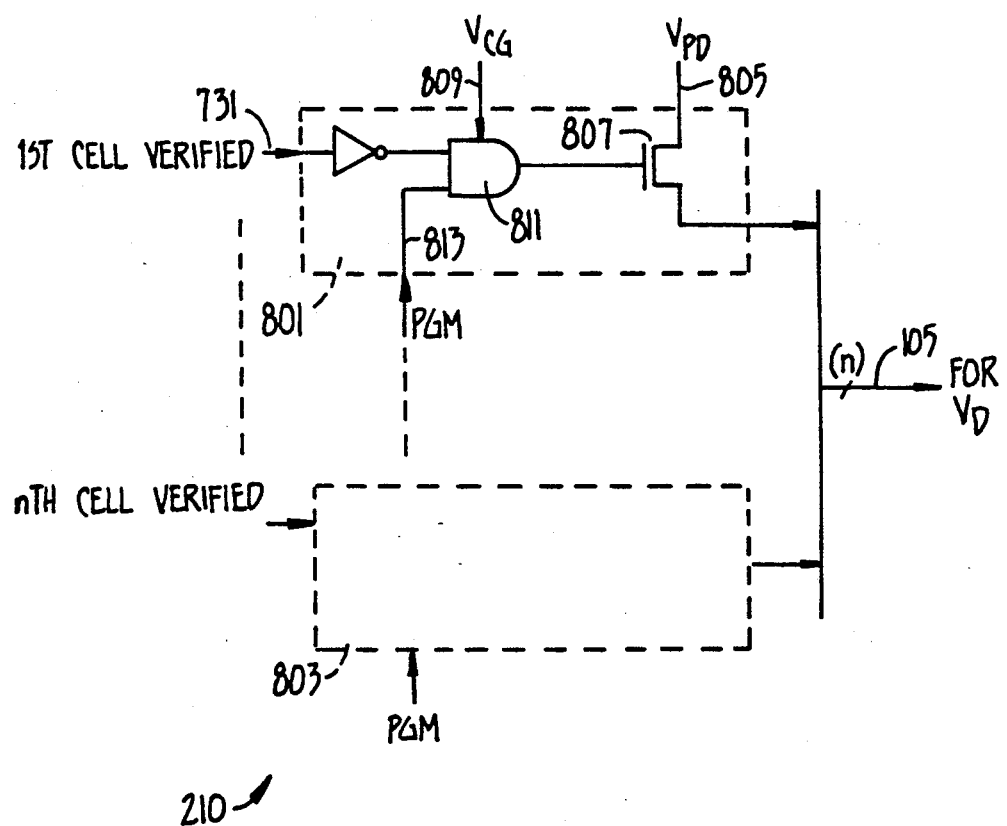
FIG._17.

|  | SELECTED CONTROL GATE $V_{CG}$ | DRAIN $V_D$ | SOURCE $V_S$ | ERASE GATE $V_{EG}$ |
|---|---|---|---|---|
| READ | $V_{PG}$ | $V_{REF}$ | $V_{SS}$ | $V_E$ |
| PROGRAM | $V_{PG}$ | $V_{PD}$ | $V_{SS}$ | $V_E$ |
| PROGRAM VERIFY | $V_{PG}$ | $V_{REF}$ | $V_{SS}$ | $V_E$ |
| ERASE | $V_{PG}$ | $V_{REF}$ | $V_{SS}$ | $V_E$ |
| ERASE VERIFY | $V_{PG}$ | $V_{REF}$ | $V_{SS}$ | $V_E$ |

TABLE 1

| (TYPICAL VALUES) | READ | PROGRAM | PROGRAM VERIFY | ERASE | ERASE VERIFY |
|---|---|---|---|---|---|
| $V_{PG}$ | $V_{CC}$ | 12V | $V_{CC}+\delta V$ | $V_{CC}$ | $V_{CC}-\delta V$ |
| $V_{CC}$ | 5V | 5V | 5V | 5V | 5V |
| $V_{PD}$ | $V_{SS}$ | 8V | 8V | $V_{SS}$ | $V_{SS}$ |
| $V_E$ | $V_{SS}$ | $V_{SS}$ | $V_{SS}$ | 20V | $V_{SS}$ |
| UNSELECTED CONTROL GATE | $V_{SS}$ | $V_{SS}$ | $V_{SS}$ | $V_{SS}$ | $V_{SS}$ |
| UNSELECTED BIT LINE | $V_{REF}$ | $V_{REF}$ | $V_{REF}$ | $V_{REF}$ | $V_{REF}$ |

$V_{SS}=0V$, $V_{REF}=1.5V$, $\delta V=0.5V-1V$

TABLE 2

MULTI-STATE EEPROM READ AND WRITE CIRCUITS AND TECHNIQUES

This is a divisional of copending application Ser. No. 07/508,273, filed Apr. 11, 1990, which is a continuation-in-part of application Ser. No. 07/337,579 filed Apr. 13, 1989, now abandoned.

BACKGROUND OF THE INVENTION

This invention relates generally to semiconductor electrically erasable programmable read only memories (EEprom), and specifically to circuits and techniques for reading and programming their state.

EEprom and electrically programmable read only memory (Eprom) are typically used in digital circuits for non-volatile storage of data or program. They can be erased and have new data written or "programmed" into their memory cells.

An Eprom utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate.

The floating gate can hold a range of charge and therefore an Eprom memory cell can be programmed to any threshold level within a threshold window. The size of the threshold window, delimited by the minimum and maximum threshold levels of the device, depends on the device's characteristics, operating conditions and history. Each distinct threshold level within the window may, in principle, be used to designate a definite memory state of the cell.

For Eprom memory, the transistor serving as a memory cell is programmed to one of two states by accelerating electrons from the substrate channel region, through a thin gate dielectric and onto the floating gate. The memory states are erasable by removing the charge on the floating gate by ultra-violet radiation.

An electrically erasable and programmable read only memory (EEprom) has a similar structure but additionally provides a mechanism for removing charge from its floating gate upon application of proper voltages. An array of such EEprom cells is referred to as a "Flash" EEprom array when an entire array of cells, or significant group of cells of the array, is erased simultaneously (i.e., in a flash). Once erased, a cell can then be reprogrammed.

A specific, single cell in a two-dimensional array of Eprom, EEprom cells is addressed for reading by application of a source-drain voltage to source and drain lines in a column containing the cell being addressed, and application of a control gate voltage to a word line connected to the control gates in a row containing the cell being addressed.

An addressed memory cell transistor's state is read by placing an operating voltage across its source and drain and on its control gate, and then detecting the level of current flowing between the source and drain. The level of current is proportional to the threshold level of the transistor, which in turn is determined by the amount of charge on its floating gate.

In the usual two-state EEprom cell, one breakpoint threshold level is established so as to partition the threshold window into two regions. The source/drain current is compared with the breakpoint threshold level that was used when the cell was programmed. If the current read is higher than that of the threshold, the cell is determined to be in a "zero" state, while if the current is less than that of the threshold, the cell is determined to be in the other state. Thus, such a two-state cell stores one bit of digital information. A current source which may be externally programmable is often provided as part of a memory system to generate the breakpoint threshold current.

Thus, for a multi-state EEprom memory cell, each cell stores two or more bits of data. The information that a given EEprom array can store is thus increased by the multiple of number of states that each cell can store.

Accordingly, it is a primary object of the present invention to provide a system of EEprom memory cells wherein the cells are utilized to store more than one bit of data.

It is a further object of the present invention to provide improved read circuits as part of an Eprom or EEprom integrated circuit memory chip.

It is also an object of the invention to provide read circuits which are simpler, easier to manufacture and have improved accuracy and reliability over an extended period of use.

It is also an object of the present invention to provide improved program circuits as part of an Eprom or EEprom integrated circuit memory chip.

It is also an object of the invention to provide program circuits which are simpler, easier to manufacture and have improved accuracy and reliability over an extended period of use.

It is another object of the present invention to provide memory read and program techniques that automatically compensate for effects of temperature, voltage and process variations, and charge retention.

It is yet another object of the present invention to provide Flash EEprom semiconductor chips that can replace magnetic disk storage devices in computer systems.

Further, it is an object of the present invention to provide a Flash EEprom structure capable of an increased lifetime as measured by the number of program/read cycles that the memory can endure.

SUMMARY OF THE INVENTION

These and additional objects are accomplished by improvements in EEprom array read and write circuits and techniques in order to provide multiple threshold levels that allow accurate reading and writing of more than two distinct states within each memory cell over an extended lifetime of the memory cells, so that more than one bit may be reliably stored in each cell.

According to one aspect of the present invention, the multiple threshold breakpoint levels are provided by a set of memory cells which serves as master reference cells. The master reference cells are independently and externally programmable, either by the memory manufacturer or the user. This feature provides maximum flexibility, allowing the breakpoint thresholds to be individually set within the threshold window of the device at any time. Also, by virtue of being an identical device as that of the memory cells, the reference cells closely track the same variations due to manufacturing processes, operating conditions and device aging. The independent programmability of each breakpoint threshold level allows optimization and fine-tuning of the threshold window's partitioning, critical in multi-state implementation. Furthermore, it allows post-manufacture configuration for either 2-state or multi-state memory from the same device, depending on user need or device characteristics at the time.

According to another aspect of the present invention, a set of memory cells within each sector (where a sector is a group of memory cells which are all erased at the same time in a Flash EEprom) are set aside as local reference cells. Each set of reference cells tracks the Flash cells in the same sector closely as they are both cycled through the same number of program/erase cycles. Thus, the aging that occurs in the memory cells of a sector after a large number of erase/reprogram cycles is also reflected in the local reference cells. Each time the sector of flash cells is erased and reprogrammed, the set of individual breakpoint threshold levels are re-programmed to the associated local reference cells. The threshold levels read from the local reference cells then automatically adjust to changing conditions of the memory cells of the same sector. The threshold window's partitioning is thus optimally maintained. This technique is also useful for a memory that employs only a single reference cell that is used to read two state (1 bit) memory cells.

According to another aspect of the present invention, the threshold levels rewritten at each cycle to the local reference cells are obtained from a set of master cells which are not cycled along with the memory cells but rather which retain a charge that has been externally programmed (or reprogrammed). Only a single set of master memory cells is needed for an entire memory integrated circuit.

In one embodiment, the read operation directly uses the threshold levels in the local reference cells previously copied from the master reference cells. In another embodiment, the read operation indirectly uses the threshold levels in the local reference cells even though the reading is done relative to the master reference cells. It does this by first reading the local reference cells relative to the master reference cells. The differences detected are used to offset subsequent regular readings of memory cells relative to the master reference cells so that the biased readings are effectively relative to the local reference cells.

According to another aspect of the present invention, a read operation on a memory cell determines which memory state it is in by comparing the current flowing therethrough with that of a set of reference currents corresponding to the multiple threshold breakpoint levels.

In one embodiment, the current flowing through a cell being read is compared one-by-one with each of the threshold current levels of the reference cells.

In another embodiment, the current flowing through a cell to be read is compared simultaneously with that of the set of reference cells. A special current mirror configuration reproduces the current to be read without degrading its signal, into multiple branches, one for each threshold current comparison.

According to another aspect of the present invention, the program and verify operations are performed on a chunk (i.e. several bytes) of addressed cells at a time. Furthermore, the verify operation is performed by circuits on the EEprom chip. This avoids delays in shipping data off chip serially for verification in between each programming step.

According to another aspect of the present invention, where a programmed state is obtained by repetitive steps of programming and verifying from the "erased" state, a circuit verifies the programmed state after each programming step with the intended state and selectively inhibits further programming of any cells in the chunk that have been verified to have been programmed correctly. This enables efficient parallel programming of a chunk of data in a multi-state implementation.

According to another aspect of the present invention, where a chunk of EEprom cells are addressed to be erased in parallel, an erased state is obtained by repetitive steps of erasing and verifying from the existing state to the "erased" state, a circuit verifies the erased state after each erasing step with the "erased" state and selectively inhibits further erasing of any cells in the chunk that have been verified to have been erased correctly. This prevents over-erasing which is stressful to the device and enables efficient parallel erasing of a group of cells.

According to another aspect of the present invention, after a group of cells have been erased to the "erased" state, the cells are re-programmed to the state adjacent the "erased" state. This ensures that each erased cell starts from a well defined state, and also allows each cell to undergo similar program/erase stress.

According to another aspect of the present invention, the voltages supplied to the control gates of the EEprom cells are variable over a wide range and independent of the voltage supplied to the read circuits. This allows accurate program/erase margining as well as use in testing and diagnostics.

The subject matter herein is a further development of the EEprom array read techniques described in copending patent application Ser. No. 204,175, filed Jun. 8, 1988, by Dr. Eliyahou Harari, particularly the disclosure relating to FIG. 11e thereof. Application Ser. No. 204,175 is hereby expressly incorporated herein by reference, the disclosure with respect to the embodiments of FIGS. 11, 12, 13 and 15 being most pertinent.

Additional objects, features and advantages of the present invention will be understood from the following description of its preferred embodiments, which description should be taken in conjunction with the accompanying drawings.

BRIEF DESCRIPTION OF THE DRAWINGS

FIG. 1 is a cross-sectional view of an EEprom device integrated circuit structure that can be used to implement the various aspects of the present invention;

FIG. 2 is a view of the structure of FIG. 1 taken across section 2—2 thereof;

FIG. 3 is an equivalent circuit of a single EEprom cell of the type illustrated in FIGS. 1 and 2;

FIG. 4 shows an addressable array of EEprom cells;

FIG. 5 is a block diagram of an EEprom system in which the various aspects of the present invention are implemented;

FIG. 6 illustrates the partitioning of the threshold window of an EEprom cell which stores one bit of data;

FIG. 7A illustrates the partitioning of the threshold window of an EEprom cell which stores two bits of data;

FIG. 7B illustrates the partitioning of the source-drain conduction current threshold window of the EEprom cell of FIG. 7A;

FIGS. 8A and 8B are curves that illustrate the changes and characteristics of a typical EEprom after a period of use;

FIG. 9A illustrates read and program circuits for a master reference cell and an addressed memory cell according to the present invention;

FIG. 9B illustrates multi-state read circuits with reference cells according to the present invention;

FIGS. 9C(1)-9C(8) illustrate the timing for multi-state read for the circuits of FIG. 9B;

FIG. 9D illustrates one embodiment of a multi-state read circuit in which the memory state of an address cell is sensed relative to a set of reference current levels simultaneously;

FIG. 9E illustrates one embodiment of an IREF circuit shown in FIG. 9D as an EEprom cell programmed with a reference current;

FIG. 9F illustrates a preferred implementation of the embodiment in FIG. 9D in which each IREF circuit is provided by a current source reproducing a reference current programmed in the EEprom cell;

FIG. 9G illustrates another embodiment of an IREF circuit shown in FIG. 9D in which a reference current is provided in each branch by the conduction of a transistor of predetermined size;

FIG. 9H illustrates another embodiment of a multi-state read circuit in which the memory state of an address cell is sensed relative to a set of reference current levels simultaneously;

FIG. 9I illustrates yet another embodiment of a multi-state read circuit in which the memory state of an address cell is sensed relative to a set of reference current levels simultaneously;

FIG. 10 illustrates a specific memory organization according to the present invention;

FIG. 11 shows an algorithm for programming a set of local reference cells according to the present invention;

FIG. 12A shows one embodiment of a read circuit using local reference cells directly;

FIG. 12B shows a read algorithm for the embodiment of FIG. 12A;

FIG. 13A shows an alternative embodiment of a read circuit using local reference cells indirectly;

FIG. 13B is a programmable circuit for the biased reading of the master reference cells according to the alternative embodiment;

FIG. 13C is a detail circuit diagram for the programmable biasing circuit of FIG. 13B;

FIG. 13D shows a read algorithm for the embodiment of FIG. 13A;

FIG. 14 illustrates the read/program data paths for a chunk of cells in parallel;

FIG. 15 shows an on chip program/verify algorithm according to the present invention;

FIG. 16 is a circuit diagram for the compare circuit according to the present invention;

FIG. 17 is a circuit diagram for the program circuit with inhibit according to the present invention;

Table 1 and 2 list typical examples of operating voltages for the EEprom cell of the present invention.

DESCRIPTION OF THE PREFERRED EMBODIMENTS

There are many specific Eprom, EEprom semiconductor integrated circuit structures that can be utilized in making a memory array with which the various aspects of the present invention are advantageously implemented.

"Split-Channel" EEprom Cell

A preferred EEprom structure is generally illustrated in the integrated circuit cross-sectional views of FIGS. 1 and 2. Describing this preferred structure briefly, two memory cells 11 and 13 are formed on a lightly p-doped substrate 15. A heavily n-doped implanted region 17 between the cells 11 and 13 serves as a drain for the cell 11 and a source for the cell 13. Similarly, another implanted n-doped region 19 is the source of the cell 11 and the drain of an adjacent cell, and similarly for another n-doped region 21.

Each of the memory cells 11 and 13 contains respective conductive floating gates 23 and 25, generally made of polysilicon material. Each of these floating gates is surrounded by dielectric material so as to be insulated from each other and any other conductive elements of the structure. A control gate 27 extends across both of the cells 11 and 13 in a manner to be insulated from the floating gates and the substrate itself. As shown in FIG. 2, conductive strips 29 and 31 are additionally provided to be insulated from each other and other conductive elements of the structure, serving as erase gates. A pair of such erase gates surrounds the floating gate of each memory cell and are separated from it by an erase dielectric layer. The cells are isolated by thick field oxide regions, such as regions 33, 35, and 37, shown in the cross-section of FIG. 1, and regions 39 and 41 shown in the view of FIG. 2.

The memory cell is programmed by transferring electrons from the substrate 15 to a floating gate, such as the floating gate 25 of the memory cell 13. The charge on the floating gate 25 is increased by electrons travelling across the dielectric from a heavily p-doped region 43 and onto the floating gate. Charge is removed from the floating gate through the dielectric between it and the erase gates 29 and 31. This preferred EEprom structure, and a process for manufacturing it, are described in detail in copending patent application Ser. No. 323,779 of Jack H. Yuan and Eliyahou Harari, filed Mar. 15, 1989, which is expressly incorporated herein by reference.

The EEprom structure illustrated in FIGS. 1 and 2 is a "split-channel" type. Each cell may be viewed as a composite transistor consisting of two transistor T1 and T2 in series as shown in FIG. 3. The T1 transistor 11a is formed along the length L1 of the channel of the cell 11 of FIG. 1. It has a variable threshold voltage $V_{T1}$. In series with the T1 transistor 11a is the T2 transistor 11b that is formed in a portion of the channel L2. It has a fixed threshold voltage $V_{T2}$ of about 1 V. Elements of the equivalent circuit of FIG. 3 are labeled with the same reference numbers as used for corresponding parts in FIGS. 1 and 2, with a prime (') added.

As can best be seen from the equivalent circuit of FIG. 3, the level of charge on the T1's floating gate 23' of an EEprom cell affects the threshold voltage $V_{T1}$ of the T1 transistor 11a when operated with the control gate 27'. Thus, a number of memory states may be defined in a cell, corresponding to well defined threshold voltages programmed into the cell by appropriate amount of charges placed on the floating gate. The programming is performed by applying, over a certain period of time, appropriate voltages to the cell's control gate 27' as well as drain 17' and source 19'.

Addressable Flash EEprom Array

The various aspects of the present invention are typically applied to an array of Flash EEprom cells in an integrated circuit chip. FIG. 4 illustrates schematically an array of individually addressable EEprom cells 60. Each cell is equivalent to the one shown in FIG. 3, having a control gate, source and drain, and an erase gate. The plurality of individual memory cells are organized in rows and columns. Each cell is addressed by selectively energizing its row and column simultaneously. A column 62, for example, includes a first memory cell 63, an adjacent second memory cell 65, and so forth. A second column 72 includes memory cells 73, 75, and so forth. Cells 63 and 73 are located in a row 76, cells 65 and 71 in another, adjacent row, and so forth.

Along each row, a word line is connected to all the control gates of the cells in the row. For example, the row 76 has the word line 77 and the next row has the word line 79. A row decoder 81 selectively connects the control gate voltage $V_{CG}$ on an input line 83 to all the control gates along a selected word line for a row.

Along each column, all the cells have their sources connected by a source line such as 91 and all their drains by a drain line such as 93. Since the cells along a row are connected in series by their sources and drains, the drain of one cell is also the source of the adjacent cell. Thus, the line 93 is the drain line for the column 62 as well as the source line for the column 72. A column decoder 101 selectively connects the source voltage $V_S$ on an input line 103 to all the sources and connects the drain voltage $V_D$ on an input line 105 to all the drains along a selected column.

Each cell is addressed by the row and column in which it is located. For example, if the cell 75 is addressed for programming or reading, appropriate programming or reading voltages must be supplied to the cell's control gate, source and drain. An address on the internal address bus 111 is used to decode row decoder 81 for connecting $V_{CG}$ to the word line 79 connected to the control gate of the cell 75. The same address is used to decode column decoder 101 for connecting $V_S$ to the source line 93 and $V_D$ to the drain line 95, which are respectively connected to the source and drain of the cell 75.

One aspect of the present invention, which will be disclosed in more detail in a later section, is the implementation of programming and reading of a plurality of memory cells in parallel. In order to select a plurality of columns simultaneously, the column decoder, in turn, controls the switching of a source multiplexer 107 and a drain multiplexer 109. In this way, the selected plurality of columns may have their source lines and drain lines made accessible for connection to $V_S$ and $V_D$ respectively.

Access to the erase gate of each cell is similar to that of the control gate. In one implementation, an erase line such as 113 or 115 or 117 is connected to the erase gate of each cells in a row. An erase decoder 119 decodes an address on the internal address bus 111 and selectively connects the erase voltage $V_{EG}$ on input line 121 to an erase line. This allows each row of cells to be addressed independently, such as the row 76 being simultaneously (Flash) erased by proper voltages applied to their erase gates through erase line 113. In this case, the Flash cell consists of one row of memory cells. However, other Flash cell's implementations are possible and most applications will provide for simultaneous erasing of many rows of cells at one time.

Flash EEprom System

The addressable EEprom array 60 in FIG. 4 forms part of the larger multi-state Flash EEprom system of the present invention as illustrated in FIG. 5. In the larger system, an EEprom integrated circuit chip 130 is controlled by a controller 140 via an interface 150. The controller 140 is itself in communication with a central microprocessor unit 160.

The EEprom chip 130 comprises the addressable EEprom array 60, a serial protocol logic 170, local power control circuits 180, and various programming and reading circuits 190, 200, 210, 220, 230 and 240.

The controller 140 controls the functioning of the EEprom chip 130 by supplying the appropriate voltages, controls and timing. Tables 1 and 2 shows typical examples of voltage conditions for the various operational modes of the EEprom cell. The addressable EEprom array 60 may be directly powered by the controller 140 or, as shown in FIG. 5, be further regulated on chip by the local power control 180. Control and data linkages between the controller 140 and the chip 130 are made through the serial in line 251 and the serial out line 253. Clock timing is provided by the controller via line 255.

In a typical operation of the EEprom chip 130, the controller 140 will send a serial stream of signals to the chip 130 via serial in line 251. The signals, containing control, data, address and timing information, will be sorted out by the serial protocol logic 170. In appropriate time sequence, the logic 170 outputs various control signals 257 to control the various circuits on the chip 130. It also sends an address via the internal address bus 111 to connect the addressed cell to voltages put out from the controller. In the meantime, if the operation is programming, the data is staged for programming the addressed cell by being sent via a serial data line 259 to a set of read/program latches and shift registers 190.

Read Circuits and Techniques Using Reference Cells

To accurately and reliably determine the memory state of a cell is essential for EEprom operations. This is because all the basic functions such as read, erase verify and program verify depend on it. Improved and novel read circuits 220 for the EEprom chip 130 and techniques of the present invention make multi-state EEprom feasible.

As discussed in connection with FIG. 3, the programmed charge placed on the floating gate 23' determines the programmed threshold voltage $V_{T1}$ of the cell. Generally, $V_{T1}$ increases or decreases with the amount of negative charge on the floating gate 23'. The charge can even be reduced to a positive value (depletion mode) where $V_{T1}$ decreases below $V_{T2}$ and even becomes negative. The maximum and minimum values of $V_{T1}$ are governed by the dielectric strength of the device material. The span of $V_{T1}$ defines a threshold voltage window in which memory states may be implemented.

Copending patent application Ser. No. 204,175, discloses an EEprom cell with memory states defined within a maximized window of threshold voltage $V_{T1}$. The full threshold voltage window includes the negative region of the threshold voltage, in addition to the usual positive region. The increased window provides more memory space to implement multi-state in an EEprom cell.

FIGS. 6 and 7 respectively illustrates the manner in which the threshold voltage window is partitioned for a 2-state memory and a 4-state memory cell. (Of course it is also possible to partition the window for a 3-state memory or even for a continuum of states in an analog, rather than digital memory).

Referring first to FIG. 6, the solid curve 343 shows $V_{T1}$ as a function of programming time. The threshold voltage window is delimited by the minimum and maximum values of $V_{T1}$, represented approximately by the Erase state level 345 and the Fully Program state level 347 respectively. The 2-state memory is implemented by partitioning the window into two halves 346, 348 using a breakpoint threshold level 349. Thus, the cell may be considered to be in memory state 0 (or state 1) if the cell is programmed with a $V_{T1}$ within region 346 (or region 348) respectively.

A typical erase/program cycle begins with erase which reduces the threshold voltage of the cell to its Erase state level 345. Subsequent repetitive programming is used to increase the threshold voltage $V_{T1}$ to the desired level. Rather than continuously applying programming voltages to the addressed cell for some fixed period of time corresponding to the state to which the cell is to be programmed, it is preferable to apply programming voltages in repetitive short pulses with a read operation occurring after each pulse to determine when it has been programmed to the desired threshold voltage level, at which time the programming terminates. The programming voltages and duration of the pulses are such that the pulses advance $V_{T1}$ across the various regions rapidly but each pulse is sufficiently fine to not overshoot any of the regions. This minimizes voltage and field related stresses on the cell, and therefore improves its reliability.

FIG. 7A illustrates the 4-state case where the threshold voltage window is partitioned into four regions 351, 353, 355, 357 by breakpoint levels 352, 354, 356 respectively. The cell is considered to be in state "3" or "2" or "1" or "0" if its $V_{T1}$ is programmed to be within corresponding regions 351 or 353 or 355 or 357 respectively. A 4-state cell is able to store two bits of data. Thus, the four states may be encoded as (1,1), (1,0), (0,1) and (0,0) respectively.

In general, if each EEprom cell is to store K states, the threshold window must be partitioned into K regions with at least K-1 threshold levels. Thus, only one breakpoint level is required for a 2-state memory cell, and three breakpoint levels are required for a 4-state cell.

In principle, a threshold voltage window may be partitioned to a large number of memory states. For example, for an EEprom device with a maximum threshold window of 16 V, it may be partitioned into thirty-two states each within an approximately half volt interval. In practice, prior art EEprom devices have only stored two states or one bit per cell with diminished reliability and life. Apart from operating with a smaller threshold window, prior devices fail to solve two other problems inherent in EEprom devices. Both problems relate to the uncertainty in the amount of charge in the floating gate and hence the uncertainty in the threshold voltage $V_{T1}$ programmed into the cell.

The first problem has to do with the endurance-related stress the device suffers each time it goes through an erase/program cycle. The endurance of a Flash EEprom device is its ability to withstand a given number of program/erase cycles. The physical phenomenon limiting the endurance of prior art Flash EEprom devices is trapping of electrons in the active dielectric films of the device. During programming, electrons are injected from the substrate to the floating gate through a dielectric interface. Similarly, during erasing, electrons are extracted from the floating gate to the erase gate through a dielectric interface. In both cases, some of the electrons are trapped by the dielectric interface. The trapped electrons oppose the applied electric field in subsequent program/erase cycles thereby causing the programmed $V_{T1}$ to shift to a lower value and the erased $V_{T1}$ to shift to a higher value. This can be seen in a gradual closure in the voltage "window" between the "0" and "1" states of prior art devices as shown in FIG. 8A. Beyond approximately $1 \times 10^4$ program/erase cycles the window closure can become sufficiently severe to cause the reading circuitry to malfunction. If cycling is continued, the device eventually experiences catastrophic failure due to a ruptured dielectric. This typically occurs at between $1 \times 10^6$ and $1 \times 10^7$ cycles, and is known as the intrinsic breakdown of the device. In prior art EEprom devices the window closure is what limits the practical endurance to approximately $1 \times 10^4$ program/erase cycles. This problem is even more critical if multi-state memory is implemented, since more accurate placement of $V_{T1}$ is demanded.

A second problem has to do with the charge retention on the floating gate. The charge on the floating gate tends to diminish somewhat through leakage over a period of time. This causes the threshold voltage $V_{T1}$ to shift also to a lower value over time. FIG. 8B illustrates the reduction of $V_{T1}$ as a function of time. Over the life time of the device $V_{T1}$ may shift by as much as 1 V. In a multi-state device, this could shift the memory by one or two states.

The present invention overcomes these problems and presents circuits and techniques to reliably program and read the various states even in a multi-state implementation.

The memory state of a cell may be determined by measuring the threshold voltage $V_{T1}$ programmed therein. Alternatively, as set forth in co-pending patent application Ser. No. 204,175, the memory state may conveniently be determined by measuring the differing conduction in the source-drain current $I_{DS}$ for the different states. In the 4-state example, FIG. 7A shows the partition in the threshold voltage window. FIG. 7B, on the other hand, illustrates typical values of $I_{DS}$ (solid curves) for the four states as a function of the control gate voltage $V_{CG}$. With $V_{CG}$ at 5 V, the $I_{DS}$ values for each of the four conduction states can be distinguished by sensing with four corresponding current sensing amplifiers in parallel. Associated with each amplifier is a corresponding reference conduction states $I_{REF}$ level (shown as broken curves in FIG. 8). Just as the breakpoint threshold levels (see FIGS. 6 and 7A) are used to demarcate the different regions in the threshold voltage window, the $I_{REF}$ levels are used to do the same in the corresponding source-drain current window. By comparing with the $I_{REF}$'s, the conduction state of the memory cell can be determined. Co-pending patent application, Ser. No. 204,175 proposes using the same sensing amplifiers and $I_{REF}$'s for both programming and reading. This provides good tracking between the reference levels (broken curves in FIG. 89) and the programmed levels (solid curves in FIG. 7B).

In the improved scheme of the present invention, the $I_{REF}$'s are themselves provided by the source-drain currents of a set of EEprom cells existing on the same chip and set aside solely for this purpose. Thus, they act as master reference cells with their $I_{REF}$'s used as reference levels for the reading and programming of all other EEprom cells on the same chip. By using the same device as the EEprom cells to act as reference cells, excellent tracking with respect to temperature, voltage and process variations is achieved. Furthermore, the charge retention problem, important in multi-state implementation, is alleviated.

Referring to FIG. 9A, one such master reference cell 400 is shown with its program and read paths. The reference cells erase and program module 410 serves to program or re-program each such reference cell 400. The module 410 includes program and erase circuits 411 with a programming path 413 connected to the drain of the master reference cell 400. The circuits 411 are initiated by addresses decoded from the internal bus 111 by a program decoder 415 and an erase decoder 417 respectively. Accordingly, programming voltages or erasing voltages are selectively supplied each reference cell such as cell 400. In this way, the reference level in each reference cell may be independently set or reprogrammed. Typically, the threshold level of each reference cell will be factory-programmed to the optimum level appropriate for each batch of chips produced. This could be done by comparison with an external standard reference level. By software control, a user also has the option to reset the reference threshold levels.

Once the reference threshold voltage $V_{T1}$ or reference drain-source current $I_{REF}$ is programmed into each reference cell 400, it then serves as a reference for the reading of an addressed memory cell such as cell 420. The reference cell 400 is connected to a first leg 403 of a current sensing amplifier 410 via a clocked switch 413. A second leg 415 of the amplifier is essentially connected to the addressed memory cell 420 whose programmed conduction state is to be determined. When cell 420 is to be read, a control signal READ will enable a switch 421 so that the cell's drain is connected to the second leg 415. The sense amplifier 410 supplies voltage via $V_{CC}$ to the drains of both the master reference cell 400 and the addressed cell 420. In the preferred embodiment, the amplifier has a current mirror configuration such that any differential in currents through the two legs 403 and 415 results in the voltage in the second leg 415 being pulled up towards $V_{CC}$ or down towards $V_S$. Thus, the node at the second leg 415 is respectively HIGH (or LOW) when the source-drain current $I_{DS}$ for the addressed cell 420 is less (or more) than $I_{REF}$ through the master reference cell 400. At the appropriate time controlled by a clocked switch 423, the sensed result at the second leg 415 may be held by a latch 425 and made available at an output line 427. When $I_{DS}$ is less than $I_{REF}$, a HIGH appears at the output line 427 and the addressed cell 420 is regarded as in the same conduction state as the master reference cell 400.

In the preferred embodiment, a voltage clamp and fast pull-up circuit 430 is also inserted between the second leg 415 and the drain 431 of the addressed cell 420. The circuit 430 serves to keep the drain voltage $V_D$ at a maximum of 1.5 V-2.0 V when it is charging up in the case of lower $I_{DS}$. It also prevents $V_D$ from pulling too low in the case of higher $I_{DS}$.

In general, if each memory cell is to store K states, then at least K-1, or preferably K reference levels need be provided. In one embodiment, the addressed cell is compared to the K reference cells using k sense amplifiers in parallel. This is preferable for the 2-state case because of speed, but may spread the available current too thin for proper sensing in the multi-state case. Thus, for multi-state case, it is preferable to compare the addressed cell with the K reference cells one at a time in sequence.

FIG. 9B illustrates more explicitly the multi-state reading configuration. The K reference cells such as 431, 433, 435 are connected to the sense amplifier 440 via the amplifier's first leg 441. The connection is time-multiplexed by clocked switches such as 451, 453, 455 respectively. The second leg 457 of the sense amplifier is connected to the addressed cell as in FIG. 9A. The sensed signal at the second leg 457 is time-selectively latched by clocked switches such as 461, 463, 465 onto such latches 471, 473, 475.

FIGS. 9C(1)-9C(8) illustrates the timing for multi-state read. When the signal READ goes HIGH, a switch 421 is enabled and the addressed memory cell is connected to the second leg 457 of the sense amplifier 440 (FIG. 9C(1)). The clocks' timing is given in FIGS. 9C(2)-9C(4). Thus, at each clock signal, the sense amplifier sequentially compares the addressed cell with each of the reference cells and latches each results. The latched outputs of the sense amplifier are given in FIGS. 9C(5)-9C(7). After all the K output states of the sense amplifier 440 are latched, they are encoded by a K-L decoder 480 ($2^L \geq K$) (FIG. 9C(8)) into L binary bits.

Thus, the multiple threshold levels are provided by a set of memory cells which serves as master reference cells. The master reference cells are independently and externally erasable and programmable, either by the device manufacturer or the user. This feature provides maximum flexibility, allowing the breakpoint thresholds to be individually set within the threshold window of the device at any time. By virtue of being the same device as that of the memory cells, the reference cells closely track the same variations due to manufacturing processes, operating conditions and charge retention problems. The independent programmability of each threshold level at will allows optimization and fine-tuning of the partitioning of the threshold window to make multi-state memory viable. Furthermore, it allows post-manufacture configuration for either 2-state or multi-state memory from the same device, depending on user need or device characteristics at the time.

Another aspect of the present invention provides improved multi-state sensing of an addressed memory cell. As discussed in connection with an earlier embodiment for sensing a mult-state memory, it is preferable to compare the cell's conduction current with all the reference conduction current levels (threshold levels) simultaneously or in parallel. For example, a 4-state memory cell has at least three reference current levels to demarcate the four states. Parallel sensing the state of the cell means simultaneous comparison of the cell's conduction current $I_{CELL}$ versus each of the three reference current levels. This is faster than comparing with each of the three reference conduction levels sequentially. However, in the simpler embodiment described earlier, the conduction current of the addressed cell would be diluted by being divided up into three branches, one for each reference level comparison. Thus, a simple implementation of simultaneous or parallel multi-state sensing may be prohibited by the signal-to-noise ratio requirement of the sensing system, especially when there are many states involved.

FIG. 9D–FIG. 9I illustrate several embodiments of simultaneous multi-state sensing without the disadvantage of degrading the conduction current of the sensed cell. In each embodiment, a one-to-many current mirror is employed to reproduce a current into many copies so that each copy may be used to compare with a reference current level at the same time.

FIG. 9D illustrates a first embodiment of simultaneous multi-state sensing. A one-to-many current mirror comprises a first transistor 910 on a first leg 920 and a second transistor 911, 912, ..., 915 respectively on each branch 921, 922, ..., 925 of a second leg. Whenever, a first current flows in the first leg 920, the second transistor on each branch of the second leg behaves as a current source and supplies a reproduced current in its branch. The ratio of reproduced current to the first current scales according to the relative sizes of the second transistor 911, 912, ..., 915 to the first transistor 910.

In the present embodiment, all the transistors have the same size as denoted by the symbol "X" shown in FIG. 9D. This results in a one-to-many current mirror in which the first current in the first leg 920 is identically reproduced in all branches 921, 922, ..., 925 of the second leg. Thus, when the conduction current $I_{CELL}$ of an addressed memory cell 420 flows through a read enabling switch 421 in the first leg 920, the same current $I_{CELL}$ is reproduced in the branches 921, 922, ..., 925 of the second leg. This is achieved without dilution of $I_{CELL}$.

Once $I_{CELL}$ is reproduced in each branch, it is compared to an associated reference current level. This is accomplished by also driving each branch with a second current source 931, 932, ..., 935 in-line with the first current source 911, 912, ..., 915 respectively. Each second current source or $I_{REF}$ circuit 931, 932, ..., 935 supplies respectively the predetermined reference current level such as $I_{REF1}$ in line 941 of the first branch, $I_{REFk}$ in line 942 of the second branch, ..., and $I_{REFk}$ in line 953 of the kth branch. The memory state is then determined by sensing the location of the $I_{CELL}$ level relative to the $I_{REF}$'s. The sensed outputs for each state denoted by SA1, SA2, ..., SAk in FIG. 9D are respectively derived from a node 951 of the first branch, a node 952 of second branch, ..., and a node 953 of the kth branch. The node in each branch is situated between the first and second current source. In general the two current sources are of opposite polarity. If the second current source 931, 932, ..., 935 is an n-channel transistor connected to $V_S$ on one end, then the first current source is a p-channel transistor 911, 912, ..., 915 connected to $V_{CC}$ on the other end. Depending on the relative levels of $I_{CELL}$ and $I_{REF}$ in the two current sources, the node is either pulled up towards $V_{CC}$ (typically, 5 V) or down towards $V_S$ (typically, 0 V). For example, in the first branch, a current $I_{CELL}$ is reproduced in line 921 and a current $I_{REF1}$ is supplied in line 941. The node 95; is respectively HIGH (or LOW) when $I_{CELL}$ is greater than (or less than) $I_{REF1}$. Thus, a memory state having an $I_{CELL}$ that lies between $I_{REF1}$ and $I_{REF2}$ would only have the node 951 HIGH, thereby resulting in a multi-state output (SA1, SA2, ..., SAk)=(0, 1, ..., 1).

In general, each $I_{REF}$ circuit 931, 932, ..., 935 can be a current source circuit pre-adjusted to supply the various reference current levels $I_{REF1}, I_{REF2}, ..., I_{REF3}$.

FIG. 9E illustrates one embodiment in EEprom applications in which each $I_{REF}$ circuit 931, 932, ..., 935 is provided respectively by a reference cell 431, 432, ..., 435 which is itself an EEprom cell similar to that described in connection with FIGS. 9A and 9B. Thus the reference cell may be applicable as a master reference cell or a local reference cell in which a reference conduction current level may be programmed.

FIG. 9F illustrates a preferred implementation where each $I_{REF}$ circuit is not provided directly by a reference cell, but rather by a reproduction of it. This enables a chunk (e.g., 64) of memory cells to share the same reference cell for simultaneous sensing. A transistor 961, 962, ..., 965 respectively in each of the $I_{REF}$ circuit 931, 932, ..., 935 serves as a current source for supplying the reproduced reference current level from each of the reference cells 431, 432, ..., 435. Each transistor is controlled by a reference voltage REF1, REF2, ..., REFk at its gate to produce the required reference current levels $I_{REF1}, I_{REF2}, ..., I_{REF3}$. Each reference voltage is furnished by a REF circuit 971, ..., ..., 975. An alternative view is that each transistor 961, 962, ..., 965 and the associated REF circuit 971, ..., ..., 975 form a double current mirror circuit by which the reference current of each reference cell 431, 432, ..., 435 is reproduced as the conduction current of the transistor 961, 962, ..., 965. Considering the $I_{REF1}$ circuit 931 as a representative, it comprises the transistor 961 as a current source for $I_{REF1}$. The $I_{REF1}$ level is obtained as a reproduction of the conduction current of the reference cell 431. The reference cell 431 supplies a reference current $I_{REF1}$ to a first leg 976 of the first current mirror that gets reproduced in a second leg 977 thereof. The second leg 977 of the first current mirror is interconnected with a first leg of the second current mirror. Thus the reproduced reference current is in turn reproduced in the second leg 941 of the second mirror by the transistor 961. Generally, the two current mirrors are of opposite polarity. For example, when the REF1 cell 431 is an n-channel transistor, the first current mirror comprises of two p-channel transistors 981 and 982 of equal size "X", and the second current mirror comprises of two n-channel transistors 983 and 961 of equal size "W".

FIG. 9G illustrates another embodiment in which the different $I_{REF}$ levels supplied by the second current source of each branch are all generated from one reference circuit 976. The reference circuit 976 provides a reference voltage that is applied to every gate of the transistor 961, 962, ..., 965 of each branch respectively. As in the embodiment illustrated in FIG. 9F, the reference voltage serves to turn on the transistors. However, the different levels of $I_{REF}$'s across the branches are now obtained by adjusting the size of the transistors 961, 962, ..., 965. For example, as illustrated in FIG. 9G, the transistors 961, 962, ..., 965 respectively have sizes of I*W, J*W, ..., K*W, where I:J: ... :K are respectively in the same ratios as $I_{REF1}:I_{REF2}: ... :I_{REFk}$. The single reference circuit 976 may be a constant voltage source or a circuit involving a reference cell similar to the REF circuit 971 in FIG. 9F. This applies under the normal current mirroring condition in which the transistors in each branch such as M81 and 961 are biased in the saturation region.

FIG. 9H illustrates another embodiment in which all the second current sources are the same across the branches but $I_{CELL}$ is reproduced by the first current source into each branch with levels scaled according to the gradation of the reference current levels. The scaling is effected by adjusting the size of each second transistor 911, 912, . . . , 915. For example, as illustrated in FIG. 9H, the second transistors 911, 912, . . . , 915 respectively have sizes of I*X, J*X, . . . , K*X, where X is the size of the first transistor 910 in the first leg 920 and I:J: . . . :K are respectively in the same ratios as $I_{REF1}:I_{REF2}: . . . :I_{REFk}$. Thus, only one REF circuit 976 is used across the branches, and furthermore, the sizes of all the transistors 961, 962, . . . , 965 are now identical. The single reference circuit 976 may be a constant voltage source or may be a circuit involving a reference cell similar to the REF circuit 971 in FIG. 9F. In one implementation, the reference circuit 976 is such that each second current source 961, 962, . . . , 965 is made to supply a current equal to the highest reference current level $I_{REFk}$. The order of the outputs from the nodes is reversed relative to the embodiments illustrated in FIGS. 9D-9G.

FIG. 9I illustrates yet another embodiment of simultaneous multi-state sensing with a circuit similar to that in FIG. 9G, except the identities of the address memory cell and the IREF circuit are interchanged. In other words, in each branch, the second current source such as 931, 932, . . . , 935 now supplies a reproduced $I_{CELL}$. This is achieved by means of an addressed memory cell circuit 977 feeding a reference voltage MC to every gate of the transistor 961, 962, . . . , 965 of each branch respectively. The circuit 977 is similar to the REF1 circuit 971 in FIG. 9F, except the REF1 CELL 431 is now replaced by the addressed memory cell 420. Similarly, the first current source such as 911, 912, . . . , 915 now supplies respectively $I_{REF1}, I_{REF2}, . . . , I_{REFk}$. The various $I_{REF}$'s are obtained by a scaled reproduction of the current of an IREF0 circuit 978. The scaling is effected by adjusting the size of each second transistor 911, 912, . . . , 915 in the one-to-many current mirror. For example, as illustrated in FIG. 9I, the second transistors 911, 912, . . . , 915 respectively have sizes of I*X, J*X, . . . , K*X, where X is the size of the first transistor 910 in the first leg 920 and 1:I:J: . . . :K are respectively in the same ratios as $I_{REF0}:I_{REF1}:I_{REF2}: . . . :I_{REFk}$. In general, the IREF0 circuit 978 may be any current source which supplies a current level of $I_{REF0}$. In one embodiment, the IREF0 circuit is an EEprom cell programmable with a reference current level, similar to that described in connection with FIGS. 9A and 9B.

Another important feature of the present invention serves to overcome the problems of endurance-related stress. As explained previously, the erase, program and read characteristics of each memory cell depends on the cumulated stress endured over the number of program/erase cycles the cell has been through. In general, the memory cells are subjected to many more program/erase cycles than the master reference cells. The initially optimized reference levels will eventually become misaligned to cause reading errors. The present underlying inventive concept is to have the reference levels also reflect the same cycling suffered by the memory cells. This is achieved by the implementation of local reference cells in addition to the master reference cells. The local reference cells are subjected to the same program/erase cycling as the memory cells. Every time after an erase operation, the reference levels in the master reference cells are recopied into the corresponding set of local reference cells. Memory cells are then read with respect to the reference levels of the closely tracking local reference cells. In this way, the deviation in cell characteristics after each program/erase cycle is automatically compensated for. The proper partitioning of the transforming threshold window is therefore maintained so that the memory states can be read correctly even after many cycles.

FIG. 10 illustrates the local cells referencing implementation for Flash EEprom. In the Flash EEprom array 60 (FIG. 4), each group of memory cells which is collectively erased or programmed is called a sector. The term "Flash sector" is analogous to the term "sector" used in magnetic disk storage devices and they are used interchangeably here. The EEprom array is grouped into Flash sectors such as 501, 503 and 505. While all memory cells in a Flash sector suffer the same cycling, different Flash sectors may undergo different cycling. In order to track each Flash sector properly, a set of memory cells in each Flash sector is set aside for use as local reference cells. For example, after the Flash sector 503 has been erased, the reference levels in the master reference cells 507 are re-programmed into the local reference cells associated with the Flash sector 503. Until the next erase cycle, the read circuits 513 will continue to read the memory cells within the Flash sector 503 with respect to the re-programmed reference levels.

FIGS. 11(1)-11(7) illustrates the algorithm to re-program a sector's reference cells. In particular, FIGS. 11(1)-11(3) relate to erasing the sector's local reference cells to their "erased states". Thus in FIG. 11(1), a pulse of erasing voltage is applied to all the sector's memory cells including the local reference cells. In FIG. 11(2), all the local reference cells are then read with respect to the master references cells to verify if they have all been erased to the "erased state". As long as one cell is found to be otherwise, another pulse of erasing voltage will be applied to all the cells. This process is repeated until all the local reference cells in the sector are verified to be in the "erased" state (FIG. 11(3)).

FIGS. 11(4)-11(7) relate to programming the local reference cells in the sector. After all the local reference cells in the sector have been verified to be in the "erased" state, a pulse of programming voltage is applied in FIG. 11(4) only to all the local reference cells. This is followed in FIG. 11(5) by reading the local reference cells with respect to the master reference cells to verify if every one of the local reference cells is programmed to the same state as the corresponding master reference cell. For those local reference cells not so verified, another pulse of programming voltage is selectively applied to them alone (FIG. 11(6)). This process is repeated until all the local reference cells are correctly verified (FIG. 11(7)) to be programmed to the various breakpoint threshold levels in the threshold window.

Once the local reference cells in the sector have been re-programmed, they are used directly or indirectly to erase verify, program verify or read the sector's addressed memory cells.

FIG. 12A illustrates one embodiment in which the local reference cells are used directly to read or program/erase verify the sector's memory cells. Thus, during those operations, a parallel pair of switches 525 is enabled by a READ signal and the sense amplifier 440 will read the sector's addressed memory cells 523 with respect to each of the sector's local reference cells 525. During program/erase verify of the local reference cells (as illustrated in FIG. 11), another parallel pair of switches 527 enables reading of the local reference cells 525 relative to the master reference cells 529.

FIG. 12B illustrates the algorithm for using the local reference cells directly to read or program/erase verify the sector's addressed memory cells.

FIG. 13A illustrates an alternative embodiment in which the local reference cells are used indirectly to read the addressed memory cells. First the master reference cells are erased and programmed each to one of the desired multiple breakpoint thresholds within the threshold window. Using these master reference thresholds the local reference cells within an erased sector of cells are each programmed to one of the same desired multiple breakpoint thresholds. Next the addressed cells in the sector are programmed (written) with the desired data. The reading sequence for the addressed cells in the sector then involves the steps illustrated in FIG. 13A.

First each of the local reference cells 525 is read relative to the corresponding master reference cell 531. This is effected by an enabling READ 1 signal to a switch 533 connecting the local reference cells 525 to the second leg 457 of the sense amplifier 440 with the master reference 531 connected to the first leg 441 of the sense amplifier. Auxiliary current source circuits associated with each master reference cell are now used to optimally bias the current through the first leg 441 of the sense amplifier to match the current in the second leg 457. After the bias adjustment operation is completed for all breakpoint threshold levels the addressed cells in the sector are read relative to the bias-adjusted master reference cells. This is effected by disabling READ 1 to 533 and enabling READ signal to switch 535. The advantage of this approach is that any variations in $V_{CC}$, temperature, cycling fatigue or other effects which may, over time, cause threshold deviations between the master reference cells and the addressed cells is eliminated prior to reading, since the local reference cells (which track threshold deviations of the addressed cells) are used to effectively readjust the breakpoint thresholds of the master reference cells. For example, this scheme permits programming of the addressed cells when the master reference cells are powered with $V_{CC}=5.5$ V and subsequently reading the addressed cells with the master reference cells powered at $V_{CC}=4.5$ V. The difference of 1 volt in $V_{CC}$, which would normally cause a change in the value of the breakpoint thresholds, is neutralized by using the local reference cells to bias adjust the master reference cells to counteract this change at the time of reading.

FIGS. 13B and 13C show in more detail one embodiment of the current biasing circuits such as 541, 543, 545 for the master reference cells 551, 553, 555. Each biasing circuit acts as a current shunt for the current in the master reference cell. For example, the circuit 541 is tapped to the drain of the master reference cell 551 through the line 561. It modifies the current in line 562 to the sense amplifier (first leg) either by sourcing current from $V_{CC}$ or draining current to $V_{SS}$. In the former case, the current in the line 562 is reduced, and otherwise for the latter case. As biasing is being established for the master reference 551, any inequality in the currents in the two legs of the sense amplifier can be communicated to outside the chip. This is detected by the controller (see FIG. 5) which in turn programs the biasing circuit 541 via the internal address bus 111 to subtract òr add current in the line 562 in order to equalize that of the local reference.

FIG. 13C illustrates an embodiment of the biasing circuit such as the circuit 541. A bank of parallel transistors such as 571, 573, 575 are all connected with their drains to $V_{CC}$, and their sources via switches such as 581, 583, 585 to the line 561. By selectively enabling the switches, different number of transistors may be used to subtract various amount of current from line 562. Similarly, another bank of parallel transistors such as 591, 593, 595 are all connected With their sources to $V_{SS}$, and their drains via switches such as 601, 603, 605 to the line 561. By selectively enabling the switches, different number of transistors may be used to add various amount of current to line 562. A decoder 609 is used to decode address from the internal address bus 111 to selectively enable the switches. The enabling signals are stored in latches 611, 613. In this way every time a sector is read, the master reference cells are re-biased relative to the local reference cells, and used for reading the memory cells in the sector.

FIGS. 13D(1)–13D(4) illustrate the read algorithm for the alternative embodiment. The sector must previous had its local reference cells programmed and verified relative to the master reference cells (FIG. 13D(1)). Accordingly, each of the master reference cells is then read relative to the local reference cells (FIG. 13D(2)). The master reference cells are biased to equalize the current to that of the corresponding local reference cells (FIG. 13D(3)). Subsequently, the memory cells in the sector are read relative to the biased master reference cells (FIG. 13D(4)).

The read circuits and operation described are also employed in the programming and erasing of the memory cells, particularly in the verifyinq part of the operation. As described previously, programming is performed in small steps, with reading of the state programmed in between to verify if the desired state has been reached. As soon as the programmed state is verified correctly, programming stops. Similarly, erasing is performed in small steps, with reading of the state of erase in between to verify if the "erased" state has been reach. Once the "erased" state is verified correctly, erasing stops.

As described previously, only K-1 breakpoint threshold levels are required to partition the threshold window into K regions, thereby allowing the memory cell to store K states. According to one aspect of the present invention, however, in the multi-state case where the threshold window is more finely partitioned, it is preferable to use K threshold levels for K state. The extra threshold level is used to distinguish the "erased" state from the state with the lowest threshold level. This prevents over-erasing and thus over-stressing the cell since erasing will stop once the "erased" state is reached. The selective inhibition of individual cells for erase does not apply to the Flash EEprom case where at least a sector must be erased each time. It is suitable those EEprom arrays where the memory cells can be individually addressed for erase.

According to another feature of the invention, after a memory cell has been erased to the "erased" state, it is programmed slightly to bring the cell to the state with the lowest threshold level (ground state) adjacent the "erased" state. This has two advantages. First, the threshold levels of the ground state of all the memory cells, being confined between the same two breakpoint threshold levels, are well-defined and not widely scattered. This provide an uniform starting point for subsequent programming of the cells. Secondly, all cells get some programming, thereby preventing those cells which tend to have the ground state stored in them, for example, from losing track with the rest with regard to program/erase cycling and endurance history.

On Chip Program Verify

As mentioned before, programming of an EEprom cell to a desired state is preferably performed in small steps starting from the "erase" state. After each programming step, the cell under programming is read to verify if the desired state has been reached. If it has not, further programming and verifying will be repeated until it is so verified.

Referring to the system diagram illustrated in FIG. 5, the EEprom chip 130 is under the control of the controller 140. They are linked serially by the serial in line 251 and serial out line 253. In prior art EEprom devices, after each programming step, the state attained in the cell under programming is read and sent back to the controller 140 or the CPU 160 for verification with the desired state. This scheme places a heavy penalty on speed especially in view of the serial link.

In the present invention, the program verification is optimized by programming a chunk (typically several bytes) of cells in parallel followed by verifying in parallel and on chip. The parallel programming is implemented by a selective programming circuit which disables programming of those cells in the chunk whose states have already been verified correctly. This feature is essential in a multi-state implementation, because some cells will reach their desired state earlier than others, and will continue pass the desired state if not stopped. After the whole chunk of cells have been verified correctly, logic on chip communicates this fact to the controller, whereby programming of the next chunk of cells may commence. In this way, in between each programming step data does not need to be shuttled between the EEprom chip and the controller, and program verification speed is greatly enhanced.

FIG. 14 illustrates the program and verify paths for a chunk of n cells in parallel. The same numerals are used for corresponding modules in the system diagram of FIG. 5. The EEprom array 60 is addressed by N cells at a time. For example, N may be 64 cells wide. In a 512 bytes Flash sector, consisting of 4 rows of 1024 cells, there will be 64 chunks of 64 cells. The source multiplexer 107 selectively connects the N sources of one addressed chunk of cells to the source voltage $V_S$ in line 103. Similarly, the drain multiplexer 109 selectively makes the N drains of the chunk accessible through an N-channel data path 105. The data path 105 is accessed by the program circuit with inhibit 210 during programming and by read circuits 220 during reading, program verifying or erase verifying.

Referring again to the system diagram in FIG. 5, programming is under the control of the controller 140. The data to be programmed into the sector is sent chunk by chunk. The controller first sends a first chunk of N*L serial data bits together with addresses, control and timing information to the EEprom chip 130. L is the number of binary bits encoded per memory cell. For example, L=1 for a 2-state cell, and L=2 for a 4-state cell. Thus if N=64 and L=2, the chunk of data bits will be 128 bits wide. The N*L data bits are stored in latches and shift registers 190 where the serial bits are converted to N*L parallel bits. These data will be required for program verify in conjunction with the read circuits 220, bit decoder 230, compare circuit 200 and the program circuit with inhibit 210.

The program algorithm for a chunk of N cells is best described by referring to both the system diagram of FIG. 5 and FIGS. 15(1)–15(7) which illustrate the algorithm itself. As mentioned in an earlier section, prior to programming the sector, the whole sector must be erased and all cells in it verified to be in the "erased" state (FIG. 15(1)). This is followed in FIG. 15(2) by programming the sector local reference cells (as shown in FIGS. 11(1)–(3)). In FIG. 15(3), the N*L bits of parallel data is latched in latches 190. In FIG. 15(4), the read circuits 220 access the N-channel data path 105 to read the states in the N chunk of cells. The read algorithm has already been described in conjunction with FIG. 12B or FIG. 13D. The N-cell reads generates N*K (K=number of states per cell) output states. These are decoded by bit decoder 230 into N*L binary bits. In FIG. 15(5), the N*L read bits are compared bit by bit with the N*L program data bits from latches 190 by compare circuit 200. In FIG. 15(6), if any read bit fails to compare with the program data bit, a further programming voltage pulse from the program circuit 210 is applied simultaneously to the chunk of cells. However, an inhibit circuit within the program circuit 210 selectively blocks programming to those cells whose bits are correctly verified with the programmed data bits. Thus, only the unverified cells are programmed each time. Programming and verification are repeated until all the cells are correctly verified in FIG. 15(7).

FIG. 16 shows one embodiment of the compare circuit 200 of FIG. 5 in more detail. The circuit 200 comprises N cell compare modules such as 701, 703, one for each of the N cells in the chunk. In each cell compare module such as the module 701, the L read bits (L=number of binary bits encoded for each cell) are compared bit by bit with the corresponding program data bits. This is performed by L XOR gates such as 711, 713, 715. The output of these XOR gates pass through an NOR gate 717 such that a "1" appears at the output of NOR gate 717 whenever all the L bits are verified, and a "0" appears when otherwise. When the control signal VERIFY is true, this result is latched to a latch 721 such that the same result at the output of NOR gate 717 is available at the cell compare module's output 725. The compare circuit 200 performs the comparisons of L bits in parallel. The N compare module's outputs such as 725, 727 are available at an N-channel output line 731 to be fed to the program circuit with inhibit 210 of FIG. 5.

At the same time, the N outputs such as 725, 727 are passed through an AND gate 733 so that its single output 735 results in a "1" when all N cells are verified and a "0" when otherwise. Referring also to FIG. 5, the single output 735 is used to signal the controller 140 that all N cells in the chunk of data have been correctly verified. The signal in output 735 is sent through the serial out line 253 via AND gate 240 during a VERIFY operation.

At power-up or at the end of program/verify of a chunk of data, all cell compare module's outputs such as 725, 727 are reset to the "not-verified" state of "0". This is achieved by pulling the node 726 to $V_{SS}$ (0V) by means of the RESET signal in line 727 to a transistor 729.

FIG. 17 shows one embodiment of the program circuit with inhibit 210 of FIG. 5 in more detail. The program circuit 210 comprises N program with inhibit modules such as 801, 803. As illustrated in Table 1 and 2, in order to program the N cells, a voltage $V_{PD}$ must be applied to each of the N cells' drain and a voltage $V_{PG}$ applied to the control gates. Each program module such as 801 serves to selectively pass $V_{PD}$ on a line 805 to one of the drains through the one of the N-channel data path 105. Since $V_{PD}$ is typically about 8 V to 9 V which is higher than $V_{CC}$, the latter cannot be used to turn on the transistor switch 807. Rather the higher voltage $V_{CG}$ (about 12 V) is used to enable switch 807. $V_{CG}$ in line 801 is itself enabled by an AND gate when both the program control signal PGM in line 813 is true and the signal in line 731 is a "0". Since the signal in line 731 is from the output of the cell compare module 701 shown in FIG. 16, it follows that $V_{PD}$ will be selectively passed onto those cells which are not yet verified. In this way, every time a programming pulse is applied, it is only applied to those cells which have not yet reached their intended states. This selective programming feature is especially necessary in implementing parallel programming and on chip verification in the multi-state case.

Variable Control of Voltage to the Control Gate

The system diagram of FIG. 5 in conjunction with Tables 1 and 2 illustrate how various voltages are applied to the EEprom array 60 to perform the basic functions of the EEprom. Prior art EEprom devices only allow the voltage supplied to the control gate $V_{CG}$ to assume one of two voltages, namely $V_{CC}$ or the higher programming voltage of about 12 V.

In another aspect of the present invention, the voltage supplied to the control gate $V_{CG}$ is allowing to be independently and continuously variable over a wide range of voltages. This is provided by $V_{PG}$ from the controller 140. In particular $V_{CG}$ in a line 83 is fed from $V_{PG}$ which is in turn supplied by the controller from a line 901. Table 2 shows $V_{PG}$ to assume various voltages under different functions of the EEprom.

The variability of $V_{CG}$ is particularly advantageous in program and erase margining schemes. In program margining, the read during program verify is done with $V_{CG}$ at a slightly higher voltage than the standard $V_{CC}$. This helps to place the programmed threshold well into the state by programming past the breakpoint threshold level with a slight margin. In erase verify, the cell is verified with a somewhat reduced $V_{CG}$ to put the cell well into the "erased" state. Furthermore, margining can be used to offset the charge retention problem described earlier (FIG. 8B).

As mentioned before, prior art EEproms typically employ $V_{CC}$ to feed $V_{CG}$ during program or erase verify. In order to do margining, $V_{CC}$ itself needs to be ramped up or reduced. This practice produces inaccurate results in the reading circuits since they are also driven by $V_{CC}$.

In the present invention, the variability of $V_{CG}$ independent of voltages supplied to the reading circuit produce more accurate and reliable results.

Furthermore, the wide range of $V_{CG}$ is useful during testing and diagnostic of the EEprom. It allows the full range of the programmed cell's threshold to be measured easily by continuing to increase $V_{CG}$ (up to the maximum limited by the device's junction breakdown).

While the embodiments of this invention that have been described are the preferred implementations, those skilled in the art will understand that variations thereof may also be possible. Therefore, the invention is entitled to protection within the full scope of the appended claims.

What is claimed is:

1. A circuit for sensing a test current relative to a plurality of predetermined current levels, comprising:
   a one-to-many current mirror means for reproducing a test current into one or more reproduced currents, said current mirror having a first leg for carrying the test current and a second leg comprising a plurality of branches, such that each branch is associated with a reference current level;
   a first current source at each branch for reproducing a reproduced current therein, said reproduced current being substantially similar to the test current in the first leg;
   a second current source at each branch for providing a reference current having one of the predetermined reference current levels; and
   means for simultaneously detecting in each branch a relatively high or low voltage at a node between first and second current sources, the relatively high or low voltage corresponding to whether the reproduced current similar to the test current provided by the first current source has magnitude greater or less than that of the reference current provided by the second current source.

2. A circuit as in claim 1, wherein said test current is provided by a conduction current of a memory cell, said conduction current designating a memory state thereof.

3. A circuit as in claim 2, wherein said memory cell is an EEprom or a Flash EEprom.

4. A circuit as in claim 1, wherein said second current source in each branch is a programmable reference current source.

5. A circuit as in claim 4, wherein said test current is provided by a conduction current of a memory cell, said conduction current designating a memory state thereof.

6. A circuit as in claim 4, wherein said memory cell is an EEprom or a flash EEprom.

7. A circuit as in claim 4, wherein said programmable reference current source is provided by a conduction current of a memory cell, said conduction current having conduction current designating a memory state thereof.

8. A circuit as in claim 7, wherein said memory cell is an EEprom or a Flash EEprom.

9. A circuit as in claim 4, wherein said programmable reference current source is duplicated from an original programmable reference current source by a circuit which comprises:
   first and second one-to-one current mirror means each having only one branch for each of its two legs, said first and second one-to-one current means being interconnected by one of their two legs, and said second current source being provided by connection to the other leg of the second one-to-one current mirror means; and
   an original programmable reference current source for providing a reference current, said original programmable reference current source being connected to the other leg of the first one-to-one current mirror means, thereby mirroring substantially similar reference current into the interconnected leg, and in turn mirroring same into the other leg of the second one-to-one current means, thereby providing said second current source with substantially similar current as that of the original programmable reference current source.

10. A circuit as in claim 9, wherein said test current is provided by a conduction current of a memory cell designating a memory state thereof.

11. A circuit as in claim 10, wherein said memory cell is an EEprom or a Flash EEprom.

12. A circuit as in claim 9, wherein said programmable reference current source is provided by a memory cell having conduction current designating a memory state thereof.

13. A circuit as in claim 12, wherein said memory cell is an EEprom or a Flash EEprom.

14. A circuit as in claim 9, wherein the one-to-many current mirror means and the first one-to-one current mirror means comprise transistors having the same polarity, and the second one-to-one current mirror means comprise transistors having the opposite polarity.

15. A circuit as in claim 1, wherein said second current source for providing a predetermined reference current in each branch comprises:
    a transistor of a predetermined size having a source, a drain and a gate; and
    means for applying a predetermined reference voltage to the gate for producing one of the predetermined reference currents through the source and drain of the transistor of predetermined size;
    said predetermined reference voltage being constant across the branches and said predetermined size differing across the branches so as to produce the plurality of predetermined reference currents among the branches.

16. A circuit as in claim 15, wherein said test current is provided by a conduction current of a memory cell, said conduction current designating a memory state thereof.

17. A circuit as in claim 16, wherein said memory cell is an EEprom or a Flash EEprom.

18. A circuit as in claim 15, wherein said constant reference current is provided by a conduction current of a memory cell, said conduction current designating a memory state thereof.

19. A circuit as in claim 18, wherein said memory cell is an EEprom or a Flash EEprom.

20. A circuit for sensing a test current relative to a plurality of predetermined reference current levels, each of the plurality of reference current levels being scalable by a multiplication factor from that of a lowest reference current level thereof, comprising:
    a one-to-many current mirror means for reproducing a test current into one or more reproduced currents, said current mirror having a first leg for carrying the test current and a second leg comprising a plurality of branches, such that each branch is associated with a reference current level and a multiplication factor;
    a first current source at each branch for reproducing a reproduced current therein, said reproduced current being scalable from the test current in the first leg by the associated multiplication factor;
    a second current source at each branch for providing a highest reference current level from among said plurality of reference current levels; and
    means for simultaneously detecting in each branch a relatively high or low voltage at a node between first and second current sources, the relatively high or low voltage corresponding to whether the reproduced current scaled from the test current provided by the first current source has magnitude greater or less than that of the highest reference current provided by the second current source.

21. A circuit as in claim 20, wherein said test current is provided by a conduction current of a memory cell, said conduction current designating a memory state thereof.

22. A circuit as in claim 21, wherein said memory cell is an EEprom or a Flash EEprom.

23. A circuit as in claim 20, wherein said highest reference current is provided by a conduction current of a memory cell, said conduction current designating a memory state thereof.

24. A circuit as in claim 23, wherein said memory cell is an EEprom or a Flash EEprom.

25. A circuit for sensing a test current relative to a plurality of predetermined reference current levels, each of the plurality of reference current levels being scalable by a multiplication factor from that of a given reference current level thereof, comprising:
    a one-to-many current mirror means for reproducing the given reference current level into one or more reproduced currents, said current mirror having a first leg for carrying the given reference current and a second leg comprising a plurality of branches, such that each branch is associated with a reference current level and a multiplication factor;
    a first current source at each branch for reproducing a reproduced current therein, said reproduced current being scalable from the given reference current level in the first leg by the associated multiplication factor;
    a second current source at each branch for providing the test current; and
    means for simultaneously detecting in each branch a relatively high or low voltage at a node between first and second current sources, the relatively high or low voltage corresponding to whether the reproduced current scaled from the lowest reference current level provided by the first current source has magnitude greater or less than that of the test current provided by the second current source.

26. A circuit as in claim 25, wherein said test current is provided by a conduction current of a memory cell, said conduction current designating a memory state thereof.

27. A circuit as in claim 26, wherein said memory cell is an EEprom or a Flash EEprom.

28. A circuit as in claim 25, wherein said lowest reference current is provided by a conduction current of a memory cell, said conduction current designating a memory state thereof.

29. A circuit as in claim 28, wherein said memory cell is an EEprom or a Flash EEprom.

30. In an integrated circuit memory system having an array of a plurality of addressable semiconductor electrically erasable and programmable memory (EEprom) cells of the type having a source, a drain, a control gate, a floating gate capable of retaining a charge level programmed into it during use of the memory system resulting in a definite memory state having a corresponding threshold of conduction current relative to one or more predetermined threshold current levels used to demarcate memory states, and an erase electrode capable of removing charge from said floating gate, and said memory system including a reading system for determining the programmed state of an addressed cell, said reading system comprising:

one or more reference memory cells constituted from the array of EEprom cells that are each respectively programmed with a charge that corresponds to each of said one or more predetermined thresholds; and means responsive to said one or more reference memory cells for comparing the threshold current level of an addressed cell with that of said one or more reference memory cells, thereby determining relative to which of said one or more predetermined threshold levels the addressed cell lies, whereby one or more bits of data stored in the addressed cell is readable therefrom; and wherein said means for comparing the threshold current level further comprising:

a one-to-many current mirror means for reproducing the threshold current level of an addressed cell into one or more reproduced currents, said current mirror having a first leg for carrying the threshold current level of an addressed cell and a second leg comprising a plurality of branches, such that each branch is associated with one of said one or more predetermined threshold levels;

a first current source at each branch for reproducing a reproduced current therein, said reproduced current being substantially similar to the threshold current level in the first leg;

a second current source at each branch for providing a reference current having one of the predetermined threshold levels; and means for simultaneously detecting in each branch a relatively high or low voltage at a node between first and second current sources, the relatively high or low voltage corresponding to whether the reproduced current similar to the threshold current level provided by the first current source has magnitude greater or less than that of one of the predetermined threshold levels provided by the second current source.

* * * * *